(12) United States Patent
Yamada et al.

(10) Patent No.: US 9,991,451 B2
(45) Date of Patent: Jun. 5, 2018

(54) ORGANIC LIGHT-EMITTING DEVICE, DISPLAY APPARATUS, IMAGE DISPLAY APPARATUS, LIGHTING APPARATUS, IMAGE FORMATION APPARATUS, AND EXPOSURE APPARATUS

(71) Applicant: CANON KABUSHIKI KAISHA, Tokyo (JP)

(72) Inventors: Naoki Yamada, Inagi (JP); Jun Kamatani, Tokyo (JP); Takayuki Ito, Kawasaki (JP); Itaru Takaya, Tokyo (JP); Minako Nakasu, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 375 days.

(21) Appl. No.: 14/685,434

(22) Filed: Apr. 13, 2015

(65) Prior Publication Data
US 2015/0303385 A1   Oct. 22, 2015

(30) Foreign Application Priority Data
Apr. 16, 2014   (JP) .................. 2014-084552

(51) Int. Cl.
| | | |
|---|---|---|
| *H01L 51/00* | (2006.01) | |
| *H05B 33/08* | (2006.01) | |
| *G03G 15/04* | (2006.01) | |
| *C09K 11/06* | (2006.01) | |
| *H01L 51/50* | (2006.01) | |

(52) U.S. Cl.
CPC .......... *H01L 51/0077* (2013.01); *C09K 11/06* (2013.01); *G03G 15/04054* (2013.01); *H05B 33/0896* (2013.01); *C09K 2211/181* (2013.01); *H01L 51/0058* (2013.01); *H01L 51/0059* (2013.01); *H01L 51/0072* (2013.01); *H01L 51/5092* (2013.01)

(58) Field of Classification Search
CPC .................................................. H01L 51/0077
USPC ........................................................ 428/690
See application file for complete search history.

(56) References Cited

U.S. PATENT DOCUMENTS

2012/0205638 A1* 8/2012 Kathirgamanathan
................................ C07C 251/24
257/40

FOREIGN PATENT DOCUMENTS

WO   2008-081178 A1   7/2008

OTHER PUBLICATIONS

Poopathy Kathirgamanathan, et al., J. Mater. Chem., Novel lithium Schiff-base cluster complexes as electron injectors; synthesis, crystal structure, thin film characterisation and their performance in OLEDs; 2012,22, 6104-6116; Jan. 2012.

* cited by examiner

*Primary Examiner* — Doris L Lee
(74) *Attorney, Agent, or Firm* — Canon U.S.A., Inc. IP Division

(57) ABSTRACT

An organic light-emitting device is provided that is driven with a low voltage and has a high luminous efficiency and a long device lifetime. The organic light-emitting device includes an anode, a cathode, a light-emitting layer disposed between the anode and the cathode, and an organic compound layer disposed between the cathode and the light-emitting layer and being in contact with the cathode. The organic compound layer includes a complex represented by Formula [1]:

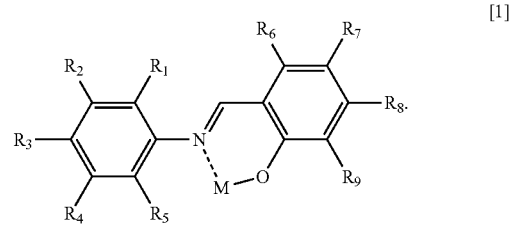

[1]

18 Claims, 3 Drawing Sheets

ORGANIC LIGHT-EMITTING DEVICE, DISPLAY APPARATUS, IMAGE DISPLAY APPARATUS, LIGHTING APPARATUS, IMAGE FORMATION APPARATUS, AND EXPOSURE APPARATUS

BACKGROUND OF THE INVENTION

Field of the Invention

The present invention relates to an organic light-emitting device, and a display apparatus, image display apparatus, lighting apparatus, image formation apparatus, and exposure apparatus each including the organic light-emitting device.

Description of the Related Art

Organic light-emitting devices are electron devices each including a pair of electrodes and an organic compound layer disposed between the electrodes. Electrons and holes are injected from the pair of electrodes into the organic compound layer to generate excitons of the organic light-emitting compound in the organic compound layer, and the organic light-emitting device emits light when the excitons return to the ground state.

In the field of organic light-emitting devices, a reduction in the voltage (driving voltage) necessary for driving a device has been being actively studied because the reduction is directly linked to the luminous efficiency and device lifetime. The driving voltage is reduced if the organic light-emitting device itself has a high charge (hole or electron) transporting ability. In the field of organic light-emitting devices, charge-transporting materials for efficiently transporting charge have been actively developed.

International Publication No. WO2008/081178 and J. Mater. Chem., 2012, 22, pp. 6104-6116 disclose the following compounds a-1 to a-3 serving as electron-injecting materials and disclose organic light-emitting devices including these compounds.

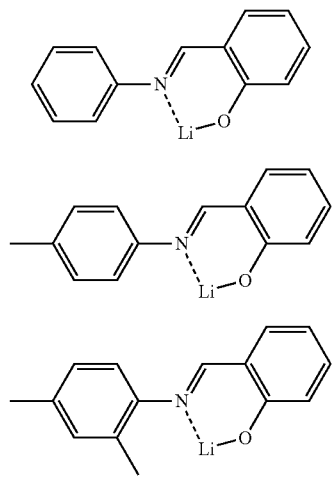

SUMMARY OF THE INVENTION

Aspects of the present invention provide an organic light-emitting device that is driven with a low voltage and has a high luminous efficiency and a long device lifetime.

The organic light-emitting device of the present invention includes:

an anode and a cathode;

a light-emitting layer disposed between the anode and the cathode; and an organic compound layer disposed between the cathode and the light-emitting layer and being in contact with the cathode, wherein the organic compound layer includes a complex represented by Formula [1]:

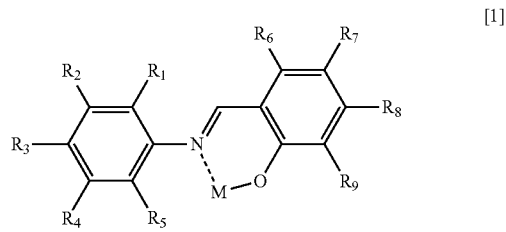

where, M represents lithium, sodium, potassium, rubidium, or cesium; $R_1$ and $R_5$ each independently represent an alkyl group having 1 to 8 carbon atoms or a fluorine atom; and $R_2$ to $R_4$ and $R_6$ to $R_9$ each independently represent a hydrogen atom, a fluorine atom, an alkyl group having 1 to 8 carbon atoms, or an aryl group, provided that at least one of $R_6$ to $R_8$ represents a fluorine atom, an alkyl group having 1 to 8 carbon atoms, or an aryl group, wherein when any one of $R_2$ to $R_4$ and $R_6$ to $R_9$ represents an aryl group, the aryl group optionally further includes a fluorine atom or an alkyl group having 1 to 8 carbon atoms; and when any one of $R_1$ to $R_9$ represents an alkyl group, a part or all of the hydrogen atoms of the alkyl group are optionally replaced by fluorine atoms.

Further features of the present invention will become apparent from the following description of exemplary embodiments with reference to the attached drawings.

DESCRIPTION OF THE EMBODIMENTS

Figure 1:
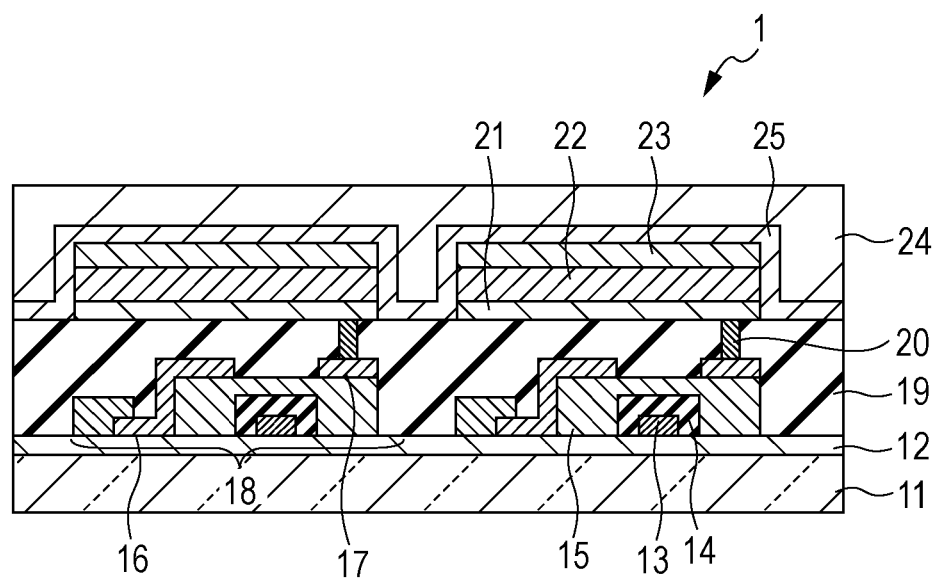
FIG. 1 is a schematic cross-sectional view illustrating an example of a display apparatus including organic light-emitting devices of the present invention and active devices connected to the organic light-emitting devices.

The organic light-emitting device of the present invention includes an anode, a cathode, a light-emitting layer disposed between the anode and the cathode, and an organic compound layer disposed between the cathode and the light-emitting layer and being in contact with the cathode.

In the present invention, the organic compound layer includes a complex represented by Formula [1]:

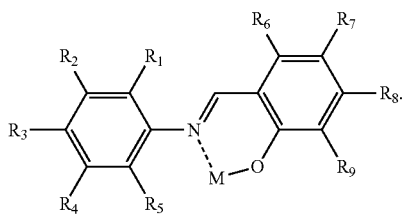

[1]

The details of the complex represented by Formula [1] are described below.

Organic Light-Emitting Device

The organic light-emitting device will now be described.

The organic light-emitting device of the present invention includes a pair of electrodes, an anode and a cathode, and a layer of an organic compound disposed between the electrodes. In the present invention, the layer of an organic compound includes a light-emitting layer and an organic compound layer described below. The organic light-emitting device of the present invention is an organic electroluminescent device in which an organic compound contained in the light-emitting layer emits light by the supply of holes and electrons from the both electrodes.

In the present invention, the organic compound layer is disposed between the cathode and the light-emitting layer and is in contact with the cathode. The organic compound layer is, therefore, a layer transporting electrons injected from the cathode to the light-emitting layer. Specifically, the organic compound layer is, for example, an electron-injecting layer or an electron-transporting layer.

Examples of the structure of the organic light-emitting device of the present invention include the following (1) to (5):

(1) (substrate/)anode/light-emitting layer/electron-injecting layer/cathode;
(2) (substrate/)anode/hole-transporting layer/electron-transporting layer/electron-injecting layer/cathode;
(3) (substrate/)anode/hole-transporting layer/light-emitting layer/electron-transporting layer/electron-injecting layer/cathode;
(4) (substrate/)anode/hole-injecting layer/hole-transporting layer/light-emitting layer/electron-transporting layer/electron-injecting layer/cathode; and
(5) (substrate/)anode/hole-transporting layer/light-emitting layer/blocking layer/electron-transporting layer/electron-injecting layer/cathode.

In the present invention, the structure of the organic light-emitting device is not limited to these five types. For example, the electrode near the substrate may be a cathode, and the layers in each of the above-mentioned five layer structures may be laminated in the reverse order. In addition, the layers (hole-transporting layer, light-emitting layer, blocking layer, electron-transporting layer, and electron-injecting layer) included in the above-mentioned five structures may be each a monolayer or a laminate composed of a plurality of layers.

In the present invention, the complex represented by Formula [1] can be contained in the electron-injecting layer.

Complex

The complex represented by Formula [1]:

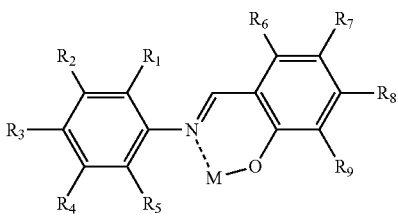

[1]

will now be described.

In Formula [1], M represents lithium, sodium, potassium, rubidium, or cesium and, in particular, can be lithium.

In Formula [1], $R_1$ and $R_5$ each independently represent an alkyl group having 1 to 8 carbon atoms or a fluorine atom. Examples of the alkyl group represented by $R_1$ or $R_5$ include methyl, ethyl, isopropyl, n-propyl, sec-butyl, tert-butyl, n-hexyl, cyclohexyl, n-heptyl, methylcyclohexyl, n-octyl, trifluoromethyl, and pentafluoroethyl groups.

In Formula [1], $R_2$ to $R_4$ and $R_6$ to $R_9$ each independently represent a hydrogen atom, a fluorine atom, an alkyl group having 1 to 8 carbon atoms, or an aryl group. Examples of the alkyl group represented by at least one of $R_2$ to $R_4$ and $R_6$ to $R_9$ are the same as those of the alkyl group represented by $R_1$ or $R_5$.

Examples of the aryl group represented by at least one of $R_2$ to $R_4$ and $R_6$ to $R_9$ include phenyl, naphthyl, pentalenyl, indenyl, azulenyl, anthryl, pyrenyl, indacenyl, acenaphthenyl, phenanthryl, phenalenyl, fluoranthenyl, acephenanthryl, aceanthryl, triphenylenyl, chrysenyl, naphthacenyl, perylenyl, pentacenyl, biphenyl, terphenyl, and fluorenyl groups.

At least one of $R_6$ to $R_8$ represents a fluorine atom, an alkyl group having 1 to 8 carbon atoms, or an aryl group and, in particular, can be an alkyl group having 1 to 8 carbon atoms.

When at least one of $R_2$ to $R_4$ and $R_6$ to $R_9$, in particular, $R_6$ to $R_9$, represents an aryl group, the aryl group can further include a fluorine atom or an alkyl group having 1 to 8 carbon atoms. Examples of the alkyl group that is optionally included in the aryl group include methyl, ethyl, isopropyl, n-propyl, sec-butyl, tert-butyl, n-hexyl, cyclohexyl, n-heptyl, methylcyclohexyl, n-octyl, trifluoromethyl, and pentafluoroethyl groups.

When any one of $R_1$ to $R_9$ represents an alkyl group, at least one of hydrogen atoms in the alkyl group or in at least one of the alkyl groups can be replaced by a fluorine atom.

Further, the substituent represented by any one of $R_1$ to $R_9$ can include a fluorine atom.

Function of Complex

In the organic light-emitting device of the present invention, the organic compound layer having an electron injection property contains a complex represented by Formula [1]. As a result, the electron injection from the cathode is accelerated, and the organic light-emitting device can be driven with a low driving voltage. The function and role of the complex of Formula [1] in the present invention will now be described.

In general, the electron-injecting materials contained in layers having an electron injection property, such as an electron-injecting layer, are inorganic alkali metal compounds such as lithium fluoride and lithium aluminum, in many cases. These compounds are, however, highly dissolved or resolved in water. Organic light-emitting devices containing inorganic alkali metal compounds are therefore required to be strictly sealed in order to ensure humidity resistance. Unfortunately, even if devices are sealed, the sealing cannot necessarily completely block water over a long period of time.

The present invention can improve the water resistance of the electron-injecting material itself by using an organic alkali metal complex having a highly hydrophobic hydrocarbon skeleton as the ligand, in particular, an organic lithium complex. As a result, the sealing of devices can be simplified or further can be omitted (non-sealed). In addition, sealed devices also can be prevented from deterioration due to absorption of moisture for a long time.

Not all organic lithium complexes can function as the electron-injecting materials in organic light-emitting devices. It is necessary to select a complex that is satisfactory in all of deposition stability, electron injection property, and film stability.

Among a large number of organic lithium complexes, the lithium complexes represented by Formula [1] (M=Li) are electron-injecting materials having high water resistance and are satisfactory in all of deposition stability, electron injection property, and film stability.

International Publication No. WO2008/081178 and J. Mater. Chem., 2012, 22, pp. 6104-6116 disclose electron-injecting materials, a-1 to a-3:

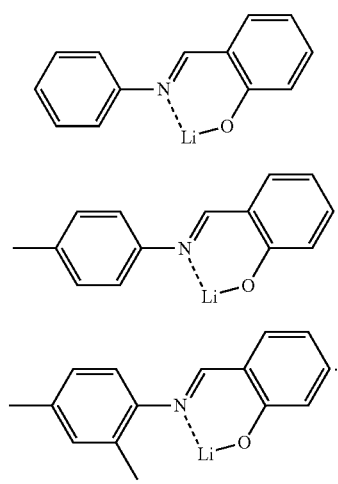

a-1 a-2 a-3

These materials differ from the complexes represented by Formula [1] of the present invention in the following aspects, which will be described using Formula [1] and compound A-2 as an example of the compounds of the present invention.

Fromula [1]

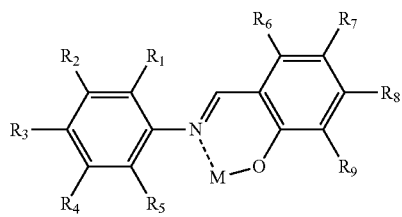

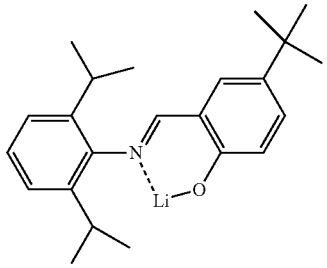

A-2

(1) $R_1$ and $R_5$ in Formula [1] are each independently an alkyl group or fluorine atom. This improves the water resistance.

In the present invention, $R_1$ and $R_5$ in Formula [1] are each independently an alkyl group or a fluorine atom to provide a structure that improves the water resistance by covering the lithium atom, which is weak in water, by the alkyl group or fluorine atom. Compound a-3 has an alkyl group as $R_5$, but does not have any substituent as $R_1$. In this case, since the bond between the carbon atom and the nitrogen atom between $R_1$ and $R_5$ can rotate, $R_1$ (hydrogen) showing small steric hindrance comes to the lithium side, and water resistance is not ensured.

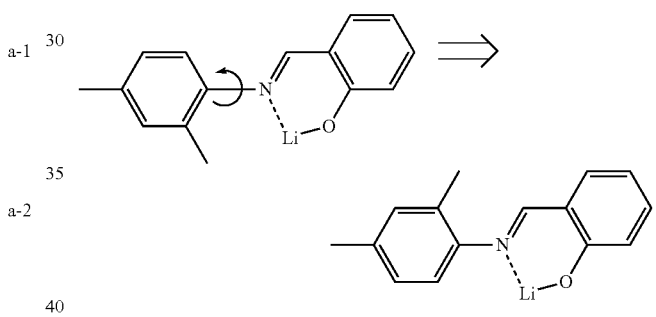

J. Mater. Chem., 2012, 22, pp. 6104-6116 describes that compound a-1 forms a condensed structure as a tetramer. In this case, four bonds between the lithium (Li) atoms and the oxygen atoms condense and form a cubic structure, and the ligands are tetramerized so as to cover the bonds. Even in this case, water molecules pass through the gaps between the ligands and react with Li. In the case of the tetramer, if $R_1$ and $R_5$ are each independently an alkyl group or a fluorine atom, the function of covering the lithium atom and the compactness of the hydrocarbon network of the ligand are enhanced to prevent water molecules from approaching the lithium atom.

(2) In Formula [1], at least one of $R_6$ to $R_8$ is an alkyl group having 1 to 8 carbon atoms, a fluorine atom, or an aryl group. This enhances the water resistance and allows formation of a film having a high amorphous property.

As described above, at least one of $R_6$ to $R_8$ can be an alkyl group having 1 to 8 carbon atoms, a fluorine atom, or an aryl group for enhancing the compactness of the hydrocarbon network by the tetramerization of the complex ligands. This further prevents water molecules from approaching the lithium atom, in addition to the aspect (1). This effect is enhanced when the substituents represented by $R_6$ to $R_8$ are bulky. Examples of such bulky substituents include secondary or tertiary alkyl groups having 3 or more carbon atoms, such as isopropyl, sec-butyl, tert-butyl, and cyclohexyl groups; and aryl groups, such as phenyl, terphenyl, fluorenyl, and naphthyl groups.

When at least one of $R_6$ and $R_8$ is an alkyl group having 1 to 8 carbon atoms, a fluorine atom, or an aryl group, an amorphous film that is stable over a long period of time can be formed.

The skeletons of compounds a-1 to a-3 are each composed of two phenyl groups. The molecules of these compounds are spatially small, easily move in a film, and are easily crystallized. When any one of $R_6$ to $R_8$ is a substituent, the molecule spatially extends, is prevented from moving in a film, and forms stable amorphous films that are not crystallized over a long period of time. The effects are enhanced when the substituents represented by $R_6$ to $R_8$ are bulky. Examples of such bulky substituents include secondary or tertiary alkyl groups having 3 or more carbon atoms, such as isopropyl, sec-butyl, tert-butyl, and cyclohexyl groups; and aryl groups, such as phenyl, terphenyl, fluorenyl, and naphthyl groups.

The aspect described above is the same when $R_2$ to $R_4$ and $R_9$ are each independently an alkyl group, a fluorine atom, or an aryl group, and a film having enhanced water resistance and a high amorphous property can be formed.

(3) When $R_1$ to $R_9$ are each independently an alkyl group or a fluorine atom, vacuum deposition can be performed at a low deposition temperature, a temperature lower than the decomposition temperature.

Since the coordinate bond between a ligand and a lithium atom in a lithium complex is lower than the covalent bond between aromatic groups, the decomposition temperature of is lower than that of a compound formed by covalent bonds alone. Vacuum deposition of a lithium complex is therefore required to be performed at a deposition temperature lower than the decomposition temperature, and it is necessary that the difference between the deposition temperature and the decomposition temperature is large.

The deposition temperature can be reduced by reducing the molecular weight. In the complex of Formula [1], however, a reduction in molecular weight deteriorates the amorphous property of the resulting film.

In such a complex, the deposition temperature can be reduced by preventing stacking of the molecules with the alkyl group or the fluorine atom represented by $R_1$ to $R_9$. Examples of the alkyl group include secondary or tertiary alkyl groups having 3 or more carbon atoms, such as isopropyl, sec-butyl, tert-butyl, and cyclohexyl groups. The effect is particularly enhanced when the substituent is a fluorine atom.

(4) When at least one of $R_1$, $R_5$, and $R_6$ to $R_8$ is an alkyl group or a fluorine atom, the complex of Formula [1] seems to be readily reduced at the cathode and thereby enhance the electron injection property.

The complex of Formula [1] seems to express the electron injection property through the reduction of the metal of the cathode and can be therefore used in the electron-injecting layer being in contact with the cathode.

In such a structure, the complex of Formula [1] includes lithium, which has a low ionization potential, as the metal center, and the lithium as the metal center is released when the cathode of, for example, aluminum is in contact with the electron-injecting layer containing the complex of Formula [1].

This is due to the reducibility of aluminum. The lithium released by reduction seems to interact with the coexisting electron-transporting material to generate a free carrier and accelerate the electron injection from the cathode.

In the complex of Formula [1] of the present invention, since the polarization of charge in the skeleton tends to be lack of electrons, the reduction at the cathode seems to readily occur. Herein, the term "skeleton" refers to the structure excluding $R_1$ to $R_9$ in Formula [1]. It seems that the effect contributes to a reduction in the driving voltage of the light-emitting device including the electron-injecting layer of the present invention.

The polarization of charge in the skeleton calculated from molecular orbitals is shown by means of the sum of the Mulliken atomic charges (Table 1). The sum of charges of the complex of the present invention is large, which means a lack of electrons.

TABLE 1

| Structure | Sum of Mulliken atomic charge |
|---|---|
| a-1 (phenyl-N=CH-phenyl-O-Li complex) | −1.96 |
| A-2 (2,6-diisopropylphenyl-N=CH-(tert-butyl substituted phenyl)-O-Li complex) | −1.26 |

The above-described effects are enhanced with an increase in the number of the alkyl group and fluorine atom.

A fluorine atom, which has a higher electron-attracting property than those of alkyl groups, seems to show higher effects. It is also seems that the effects can be obtained even when the position of the substituent is other than $R_1$, $R_5$, and $R_6$ to $R_8$.

The molecular orbital calculation was performed using Gaussian 09 (Gaussian 09, Revision C.01, M. J. Frisch, G. W. Trucks, H. B. Schlegel, G. E. Scuseria, M. A. Robb, J. R. Cheeseman, G. Scalmani, V. Barone, B. Mennucci, G. A. Petersson, H. Nakatsuji, M. Caricato, X. Li, H. P. Hratchian, A. F. Izmaylov, J. Bloino, G. Zheng, J. L. Sonnenberg, M. Hada, M. Ehara, K. Toyota, R. Fukuda, J. Hasegawa, M. Ishida, T. Nakajima, Y. Honda, O. Kitao, H. Nakai, T. Vreven, J. A. Montgomery, Jr., J. E. Peralta, F. Ogliaro, M. Bearpark, J. J. Heyd, E. Brothers, K. N. Kudin, V. N. Staroverov, T. Keith, R. Kobayashi, J. Normand, K. Raghavachari, A. Rendell, J. C. Burant, S. S. Iyengar, J. Tomasi, M. Cossi, N. Rega, J. M. Millam, M. Klene, J. E. Knox, J. B. Cross, V. Bakken, C. Adamo, J. Jaramillo, R. Gomperts, R. E. Stratmann, O. Yazyev, A. J. Austin, R. Cammi, C. Pomelli, J. W. Ochterski, R. L. Martin, K. Morokuma, V. G. Zakrzewski, G. A. Voth, P. Salvador, J. J. Dannenberg, S. Dapprich, A. D. Daniels, O. Farkas, J. B. Foresman, J. V. Ortiz, J. Cioslowski, and D. J. Fox, Gaussian, Inc., Wallingford Conn., 2010), which is widely used at present.

The calculation was performed by a density functional method (B3LYP/3-21G).

Examples of Complex
Examples of the complex of Formula [1] are shown below, but the present invention is not limited to the following examples.
[Group A]
A-1
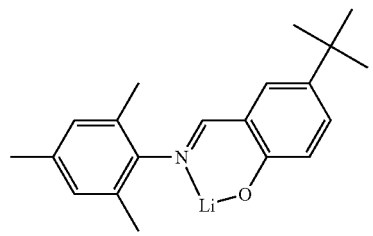
A-2
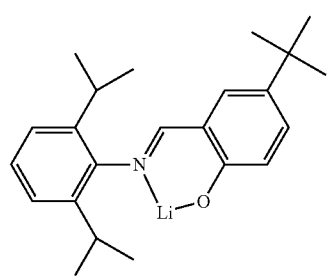
A-3
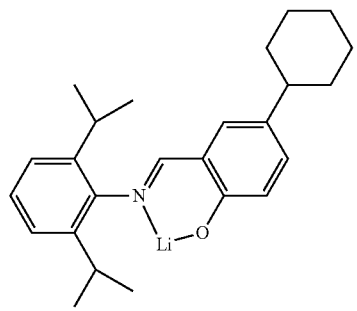
A-4
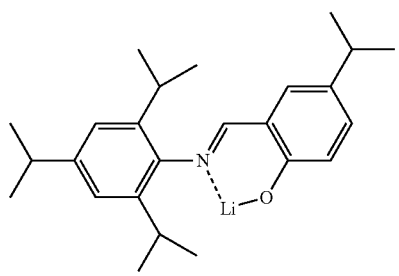
A-5
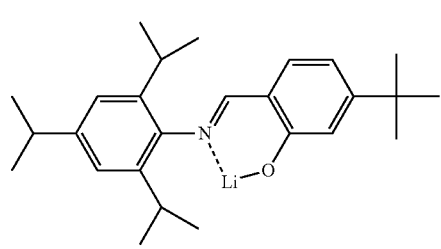
-continued
A-6
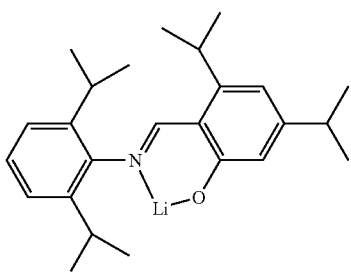
A-7
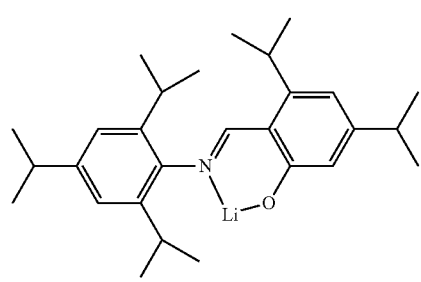
A-8
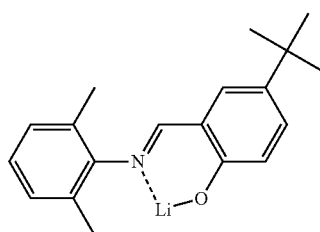
A-9
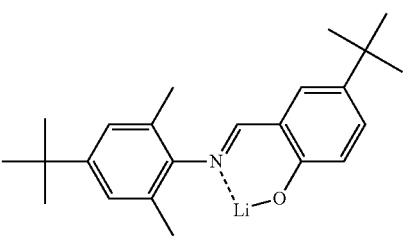
A-10
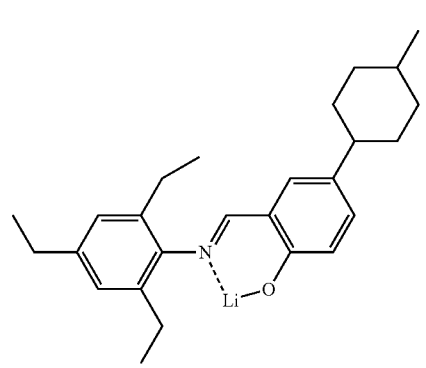

[Group B]
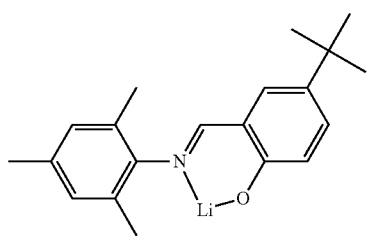
A-1
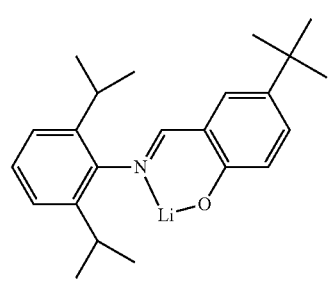
A-2
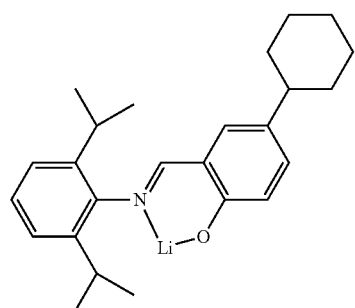
A-3
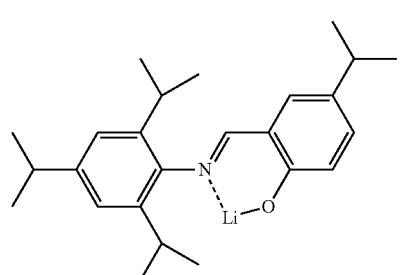
A-4
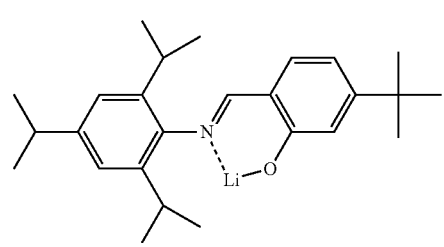
A-5
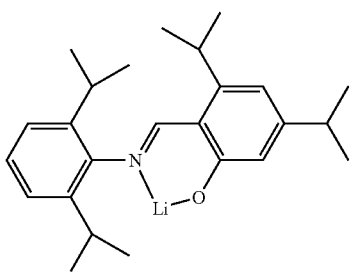
A-6
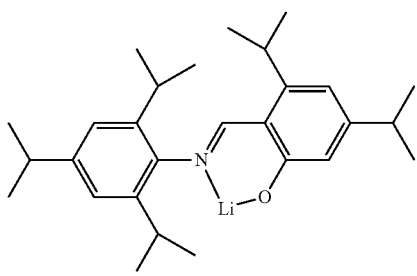
A-7
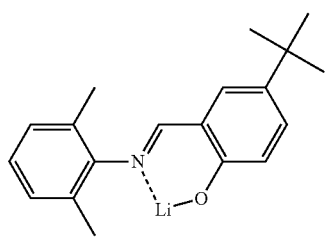
A-8
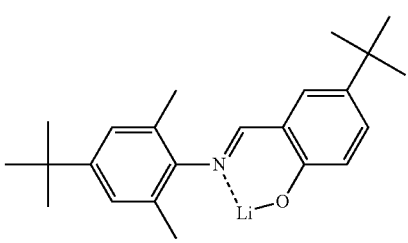
A-9
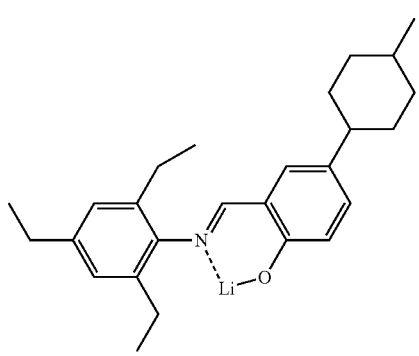
A-10

[Group C]
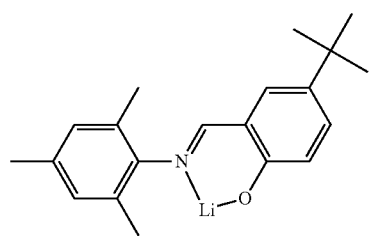
A-1
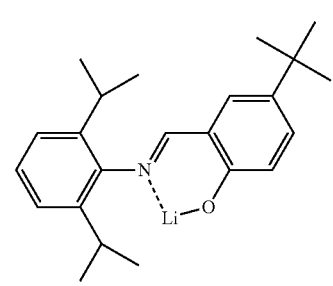
A-2
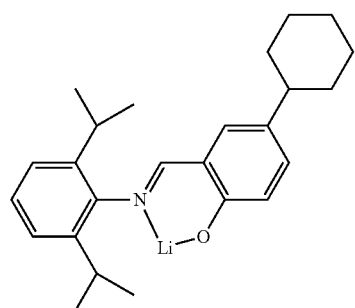
A-3
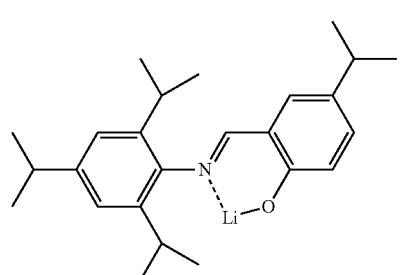
A-4
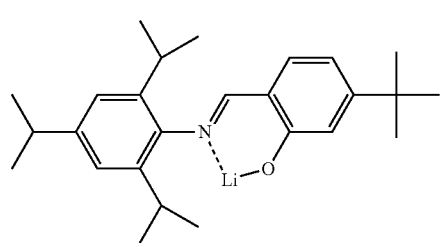
A-5
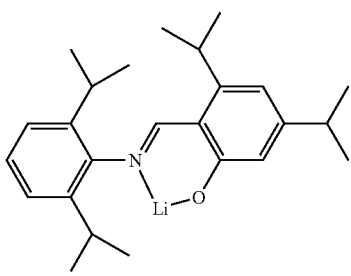
A-6
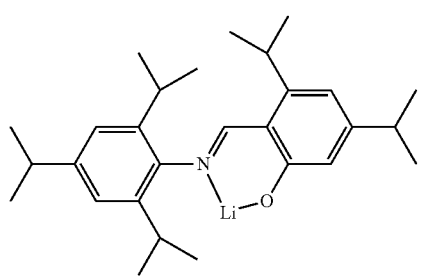
A-7
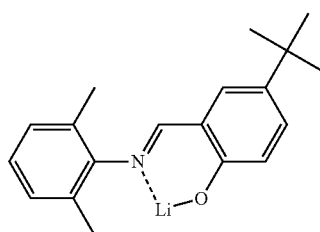
A-8
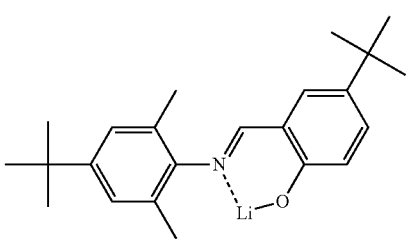
A-9
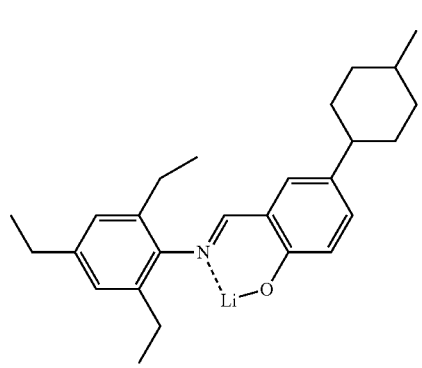
A-10

-continued

[Group D]

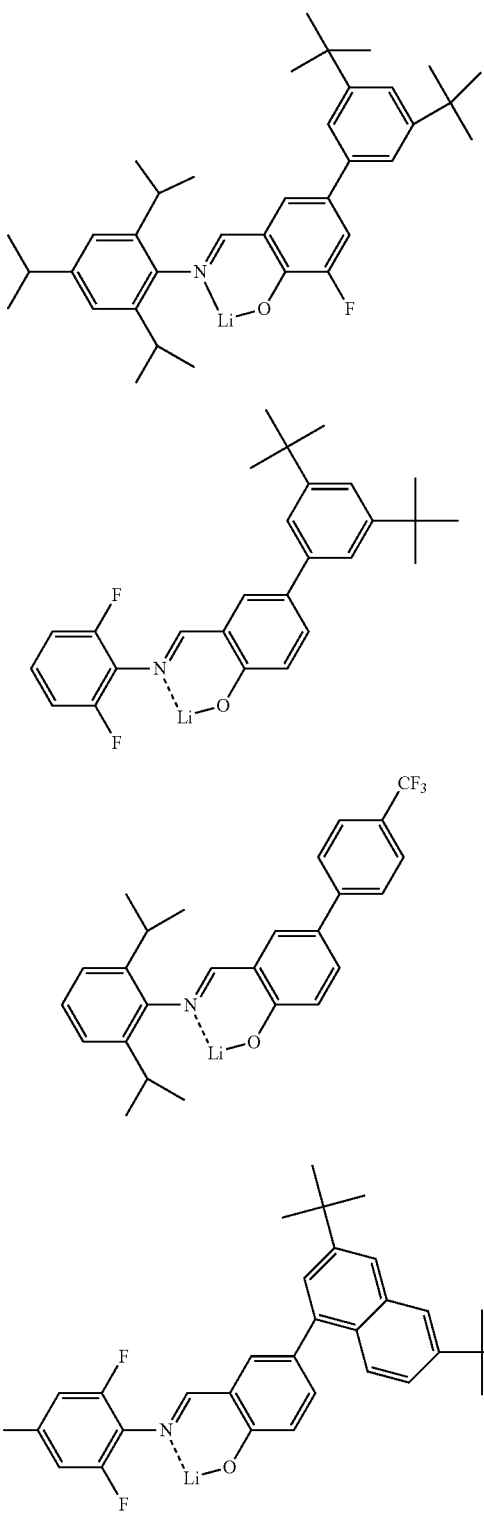

Among the compounds shown above, in the compounds belonging to group A (A-1 to A-10), $R_1$ and $R_5$ in Formula [1] are alkyl groups, and at least one of $R_6$ to $R_8$ is an alkyl group. The sublimation temperatures of the complexes themselves are reduced by the introduction of alkyl groups at $R_1$ and $R_5$ and at least one of $R_6$ to $R_8$. As a result, the deposition temperature in the production of devices can be reduced.

Among the compounds shown above, in the compounds belonging to group B (B-1 to B-10), at least one of $R_1$ to $R_9$ in Formula [1] is fluorine. The sublimation temperature is further reduced by the introduction of fluorine into the compounds. As a result, the deposition temperature in the production of devices can be reduced. In addition, since the introduction of fluorine into the compounds causes a further lack of electrons of the charge of the skeleton, reduction by the electrons injected from the cathode is readily caused. As a result, the driving voltage of the organic light-emitting device can be reduced.

Among the compounds shown above, in the compounds belonging to group C (C-1 to C-12), $R_1$ and $R_5$ in Formula [1] are alkyl groups, and at least one of $R_6$ to $R_8$ is an aryl group. The sublimation temperatures of the compounds themselves are reduced by the introduction of alkyl groups at $R_1$ and $R_5$. As a result, the deposition temperature in the production of devices can be reduced. The compounds themselves are prevented from crystallizing over a long period of time when at least one of $R_6$ to $R_8$ is an aryl group. As a result, stable amorphous films can be formed.

Among the compounds shown above, the compounds belonging to group D (D-1 to D-4) are complexes having the following features (d1) to (d3):

(d1) at least one of $R_6$ to $R_8$ in Formula [1] is an aryl group;

(d2) at least one of $R_1$ to $R_9$ is an alkyl group, and/or the aryl group mentioned in feature (d1) has an alkyl group as a substituent; and (d3) at least one of $R_1$ to $R_9$ is a fluorine atom or an alkyl group including a fluorine atom, and/or the aryl group mentioned in feature (d1) has a fluorine atom or an alkyl group including a fluorine atom as a substituent.

The compounds belonging to group D have low sublimation temperatures of the compound themselves due to features (d2) and (d3). As a result, the deposition temperature in the production of devices can be reduced. The compounds belonging to group D can form stable amorphous films that are not crystallized for a long period of time due to feature (d1). In the compounds belonging to group D, a further lack of electrons of the charge of the skeleton is caused due to feature (d3), and reduction by the electrons injected from the cathode is readily caused. As a result, the driving voltage of the organic light-emitting device can be reduced.

The organic compound layer in the present invention may be formed of only a complex of Formula [1] or may be formed of a complex of Formula [1] and another compound.

The organic compound layer formed of a complex of Formula [1] and another compound may contain the complex of Formula [1] in any concentration. The concentration can be 50% or less, in particular, 20% or less.

The material contained in the organic compound layer together with the complex of Formula [1] can be an electron-injecting material. Examples of the electron-injecting material include anthraquinone derivatives, oxadiazole derivatives, oxazole derivatives, pyrazine derivatives, triazole derivatives, triazine derivatives, quinoline derivatives, quinoxaline derivatives, phenanthroline derivatives, organic aluminum complexes, and condensed ring compounds (e.g., fluorene derivatives, naphthalene derivatives, chrysene derivatives, and anthracene derivatives).

Examples of the electron-injecting material contained in the organic compound layer are shown below, but the present invention is not limited to the following compounds.

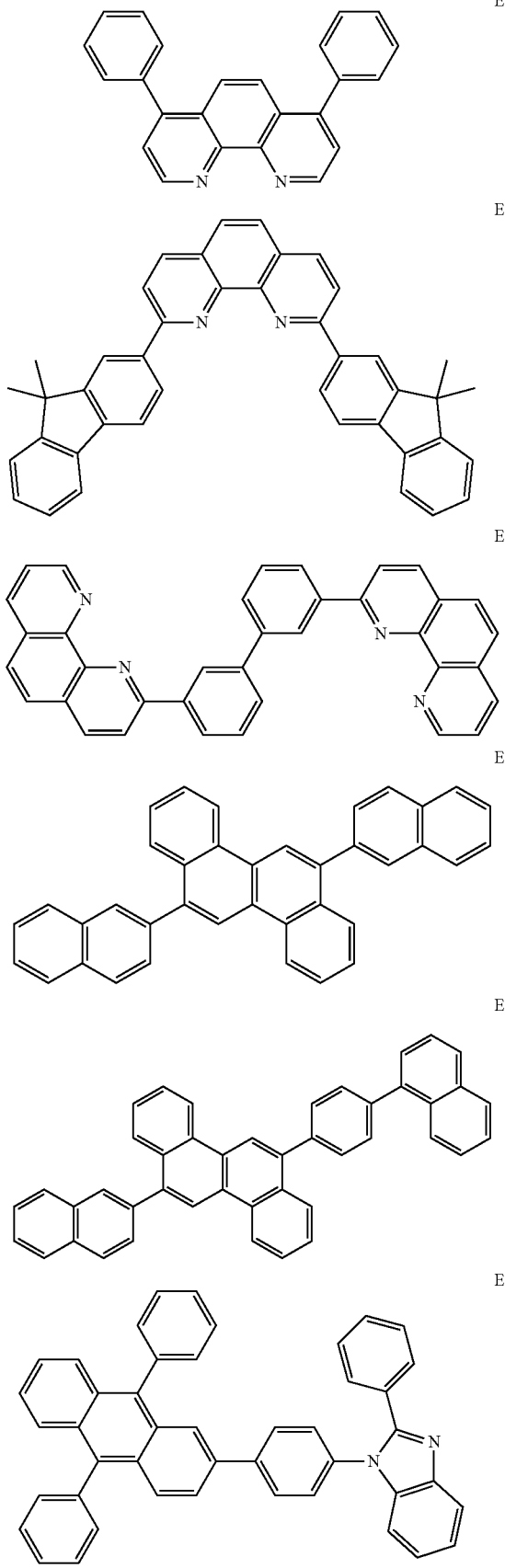
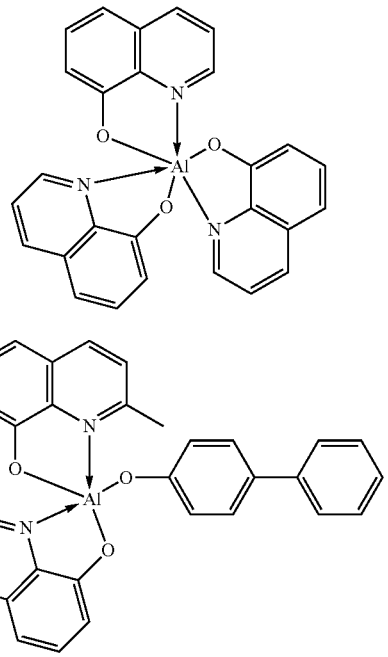
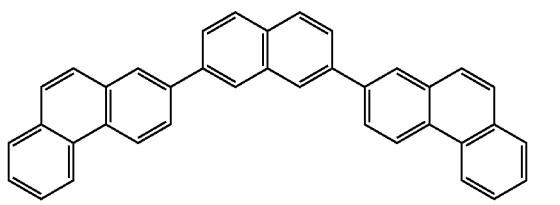
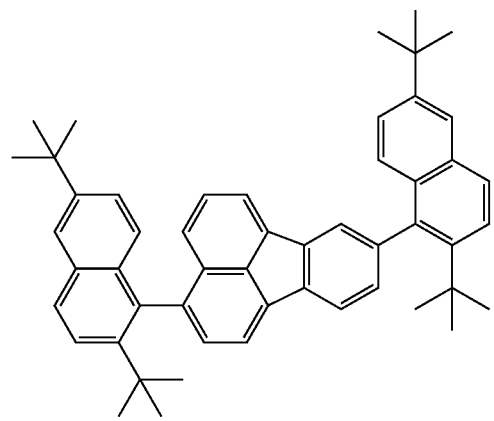
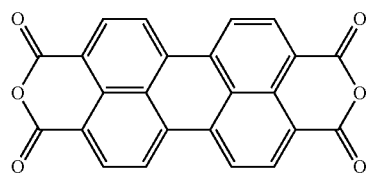
Other constitutional material of organic light-emitting device
In addition to the complex of Formula [1], known materials can be used as the constitutional materials of the organic light-emitting device of the present invention.
In addition to the complex of Formula [1], an electron-injecting material may be further used together with the complex. Examples of the electron-injecting material include alkali metals, alkaline earth metals, rare earth metals, oxides of alkali metals, halides of alkali metals, carbonates of alkali metals, alkali metal complexes, oxides of alkaline earth metals, halides of alkaline earth metals, alkaline earth metal complexes, oxides of rare earth metals, halides of rare earth metals, and rare earth metal complexes. These metals and metal compounds can be used for enhancing the function of a layer having an electron injection property (for example, the organic compound layer), rather than as constitutional materials of layers constituting organic light-emitting devices.

The hole injecting or transporting material can be a material having a high hole mobility such that holes are easily injected from the anode and that the injected holes can be transported to a light-emitting layer. In order to prevent the deterioration of film quality, such as crystallization, in the organic light-emitting device, a material having a high glass transition temperature can be used. Examples of a low-molecular or high-molecular material having a hole injecting or transporting property include triarylamine derivatives, arylcarbozole derivatives, phenylenediamine derivatives, stilbene derivatives, phthalocyanine derivatives, porphyrin derivatives, poly(vinylcarbazole), poly(thiophene), and other electrically conductive polymers. These hole injecting or transporting materials can also be used in the electron blocking layer.

Examples of the compound that is used as the hole injecting or transporting material are shown below, but the present invention is not limited to the following compounds.

HT1

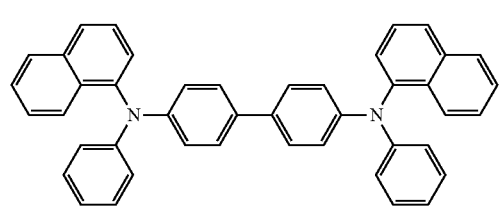

HT2

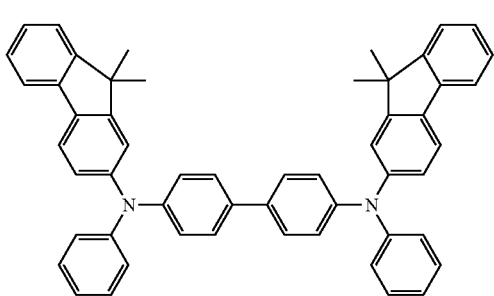

HT3

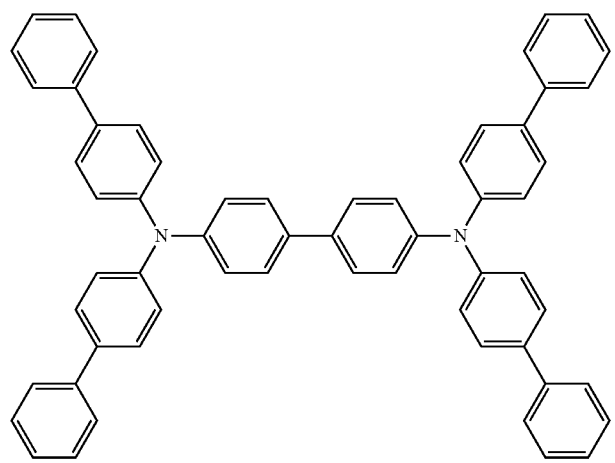

HT4

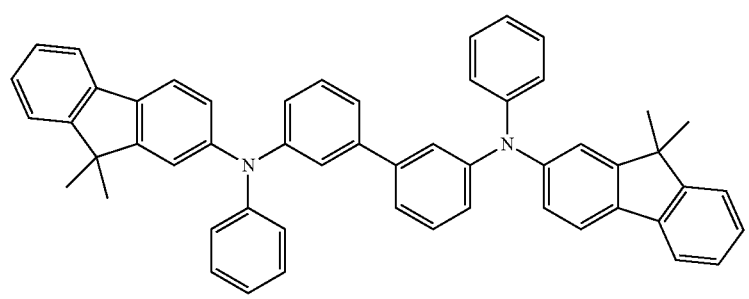

-continued
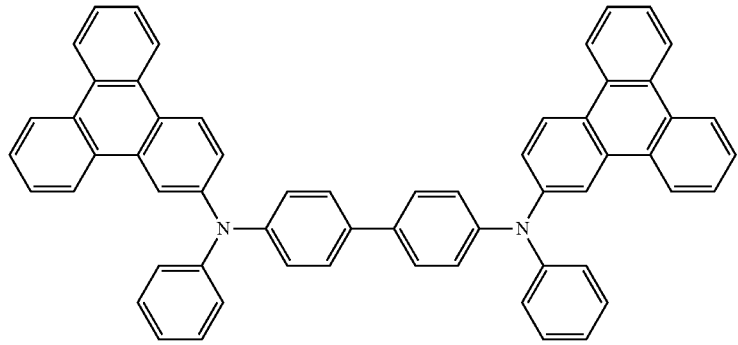
HT5
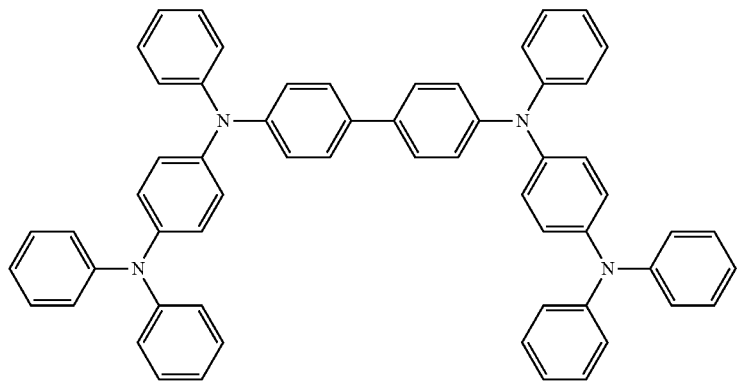
HT6
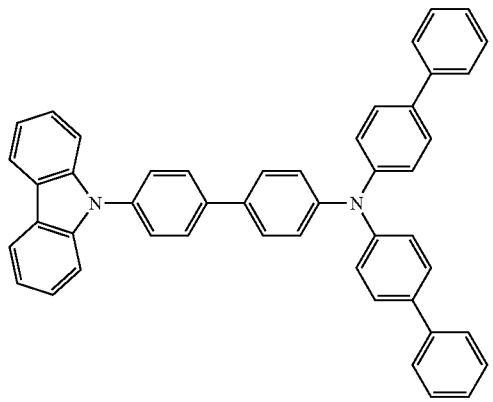
HT7
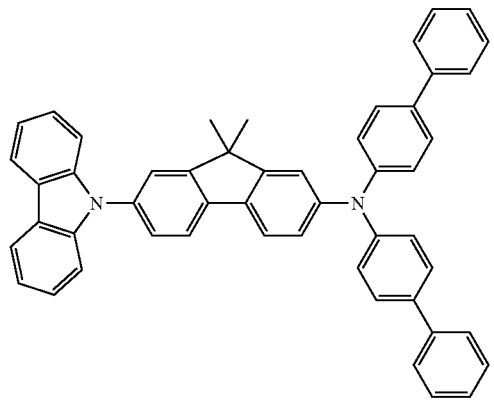
HT8
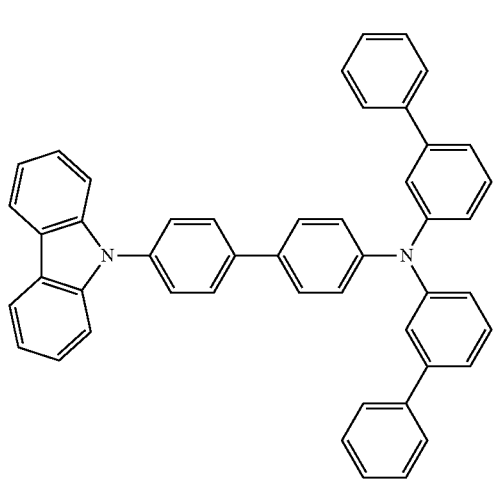
HT9
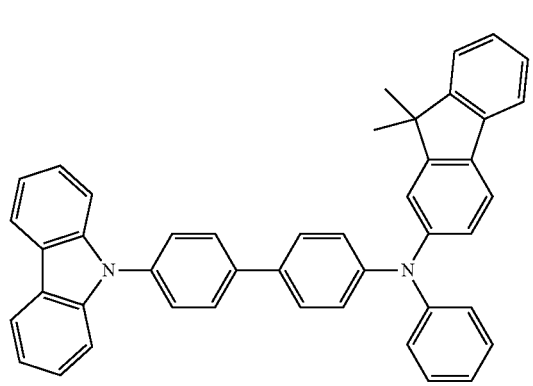
HT10

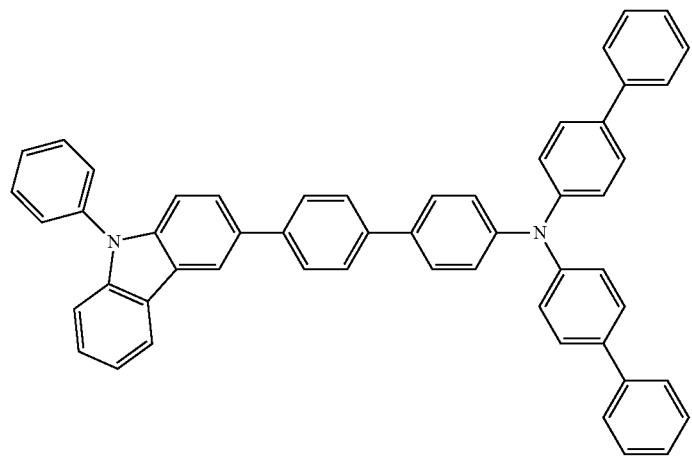
HT11

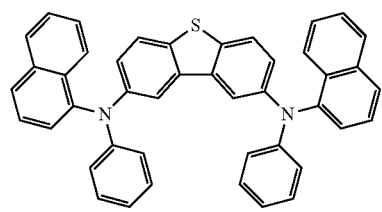
HT12

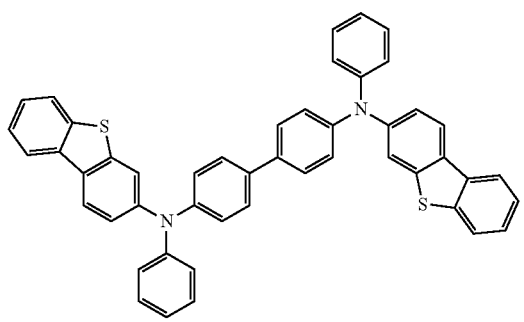
HT13

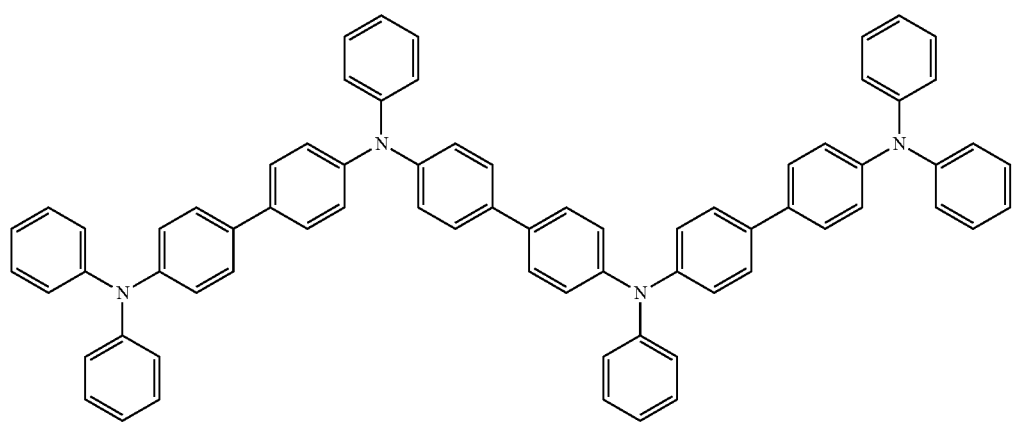
HT14

Examples of the light-emitting material mainly involved in the light-emitting function include condensed ring compounds (e.g., fluorene derivatives, naphthalene derivatives, pyrene derivatives, perylene derivatives, tetracene derivatives, anthracene derivatives, and rubrene), quinacridone derivatives, coumarin derivatives, stilbene derivatives, organic aluminum complexes such as tris(8-quinolinolato)aluminum, iridium complexes, platinum complexes, rhenium complexes, copper complexes, europium complexes, ruthenium complexes, and polymer derivatives such as poly(phenylenevinylene) derivatives, poly(fluorene) derivatives, and poly(phenylene) derivatives.

Examples of the compound that is used as the light-emitting material are shown below, but the present invention is not limited to the following compounds.

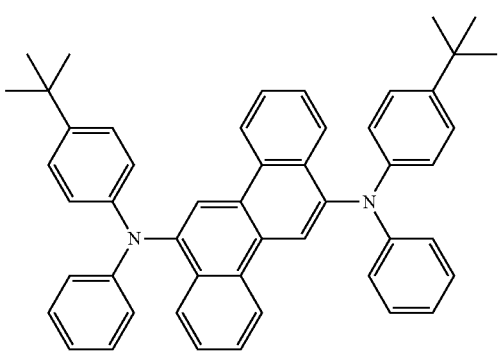
BD1

-continued
BD2
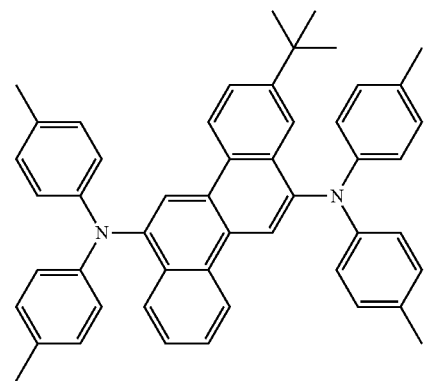
BD3
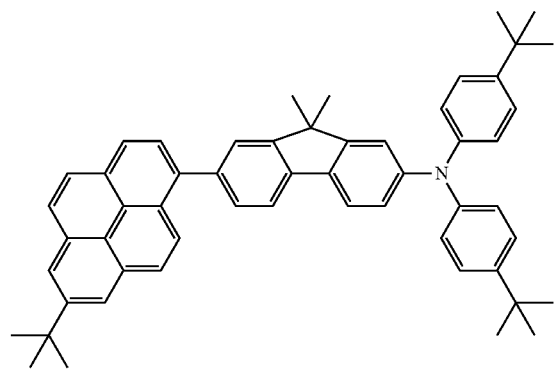
BD4
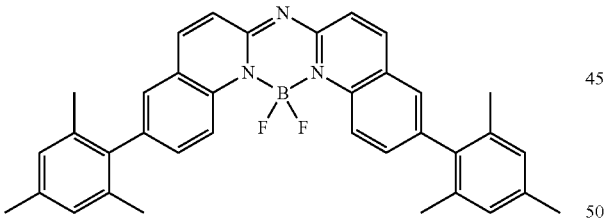
BD5
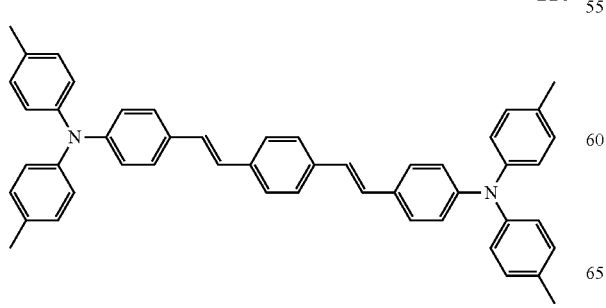
-continued
BD6
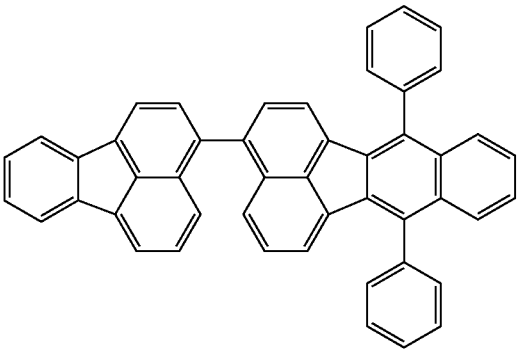
BD7
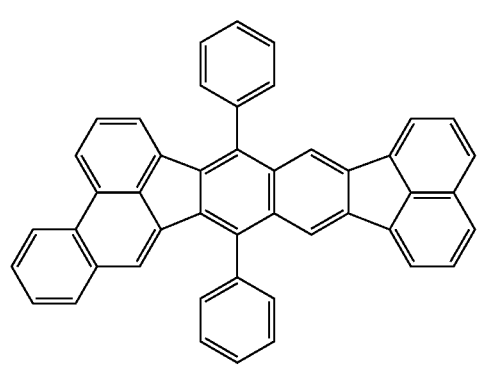
BD8
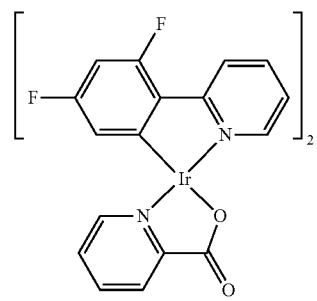
GD1
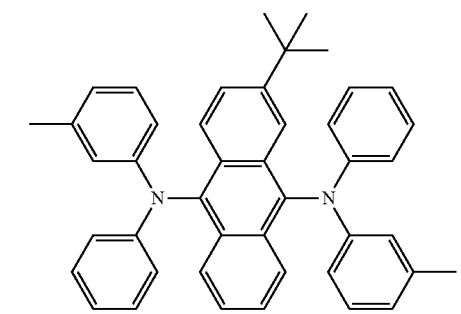
GD2
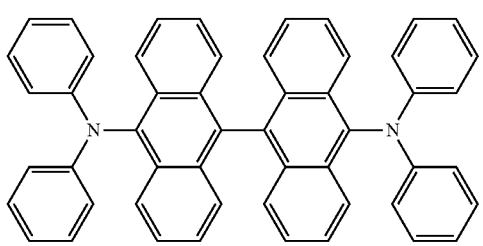

-continued
GD3
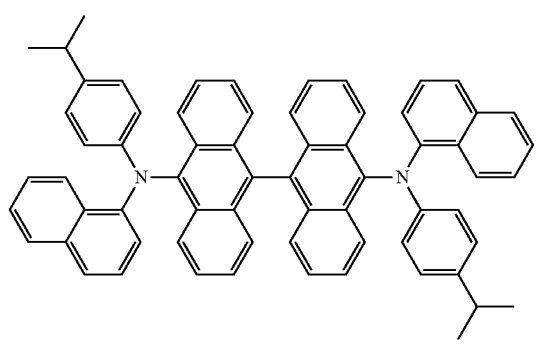
GD4
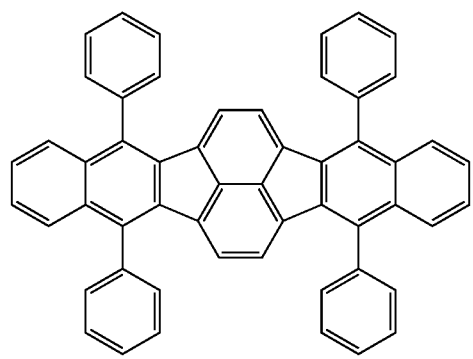
GD5
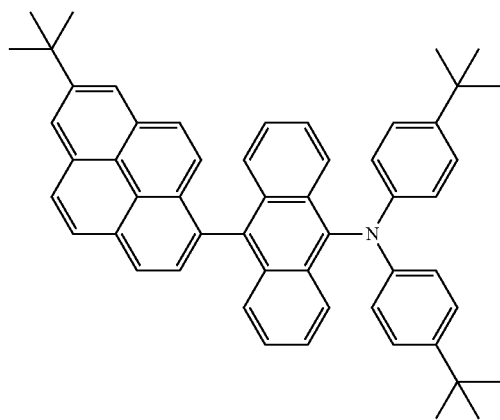
GD6
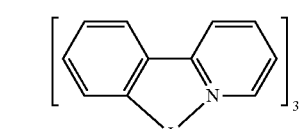
GD7
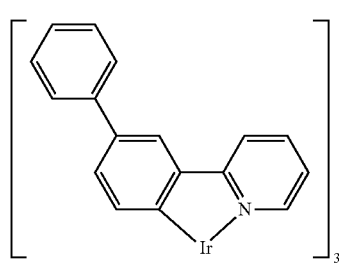
-continued
GD8
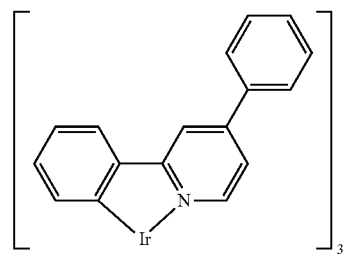
RD1
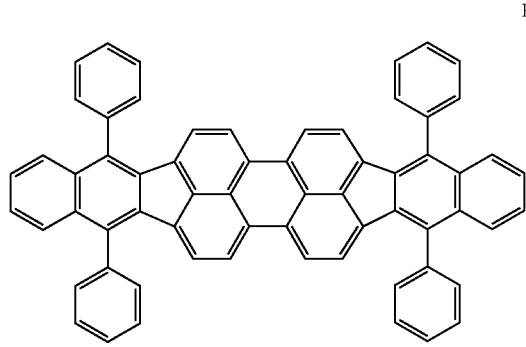
RD2
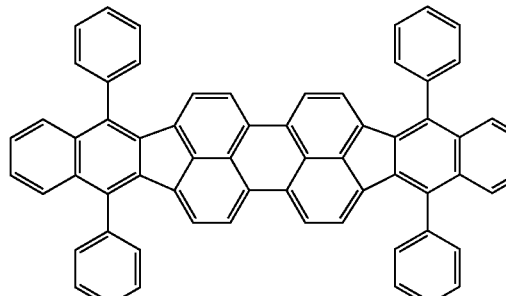
RD3
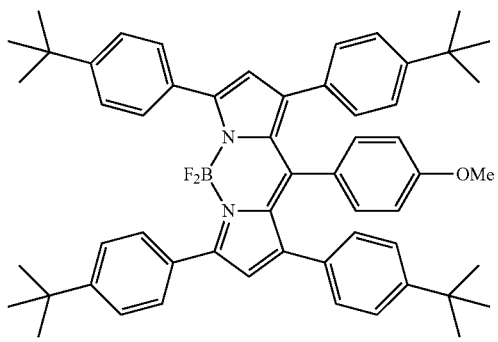
RD4
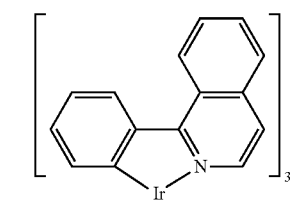

RD5

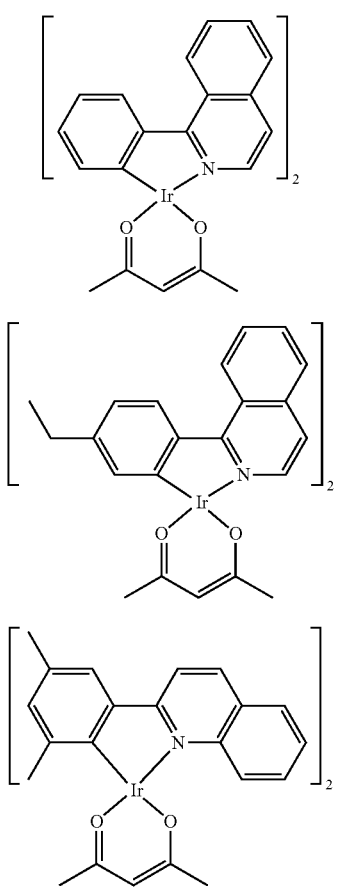

RD6

RD7

RD8

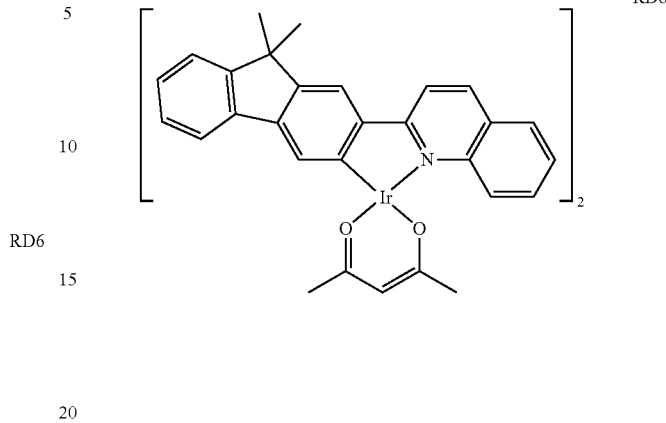

In the present invention, the light-emitting layer may contain a material for improving the light-emitting function possessed by the light-emitting layer itself, such as a host or light emission assist material. Examples of the compound that is used as the host or light emission assist material include aromatic hydrocarbon compounds and derivatives thereof, carbazole derivatives, dibenzofuran derivatives, dibenzothiophene derivatives, organic aluminum complexes such as tris(8-quinolinolato)aluminum, and organic beryllium complexes.

Examples of the compound that is used as the host or light emission assist material are shown below, but the present invention is not limited to the following compounds.

EM1

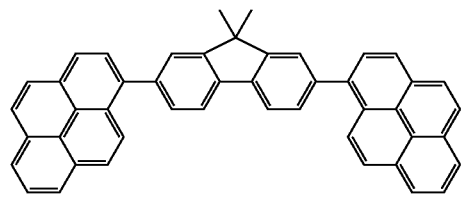

EM2

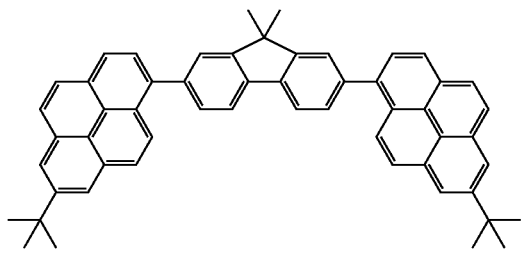

EM3

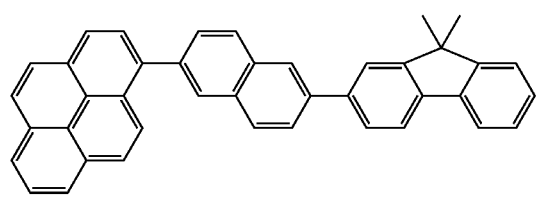

EM4

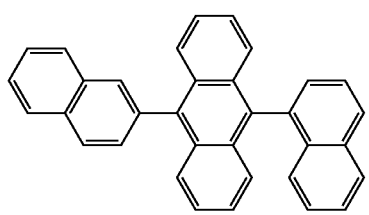

EM5

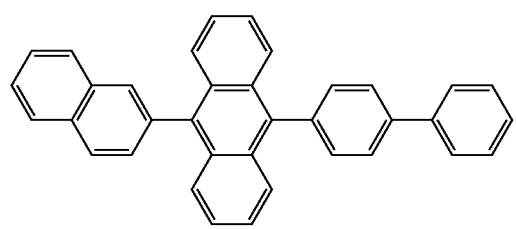

EM6

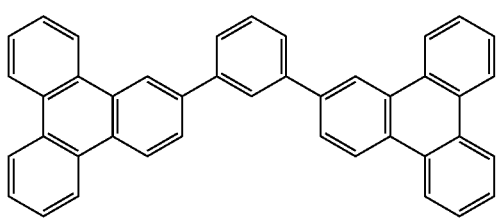

-continued
EM7
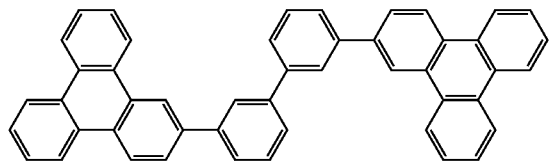
EM8
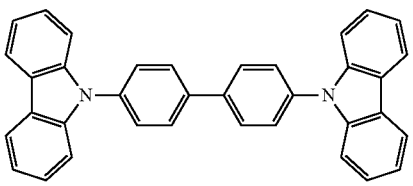
EM9
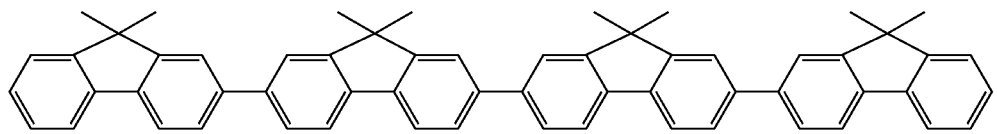
EM10
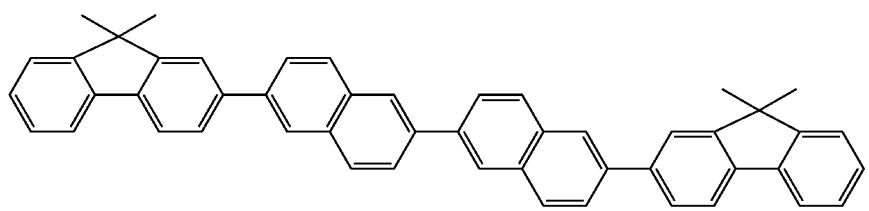
EM11
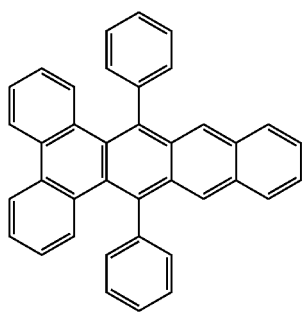
EM12
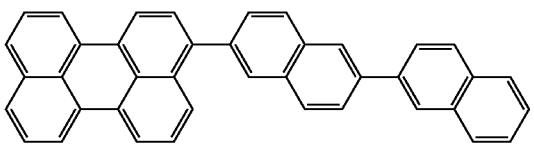
EM13
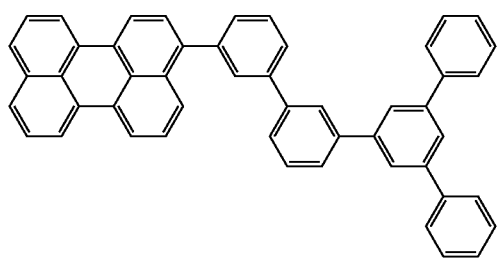
EM14
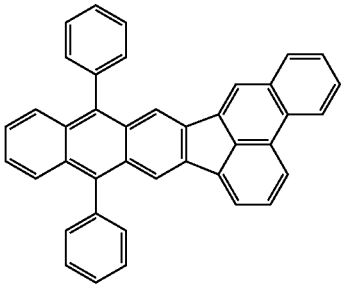
EM15
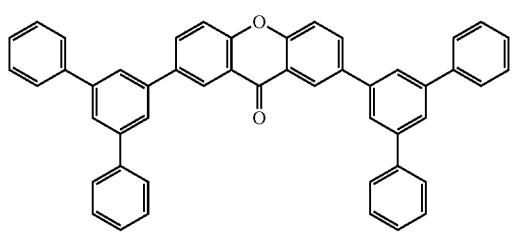
EM16
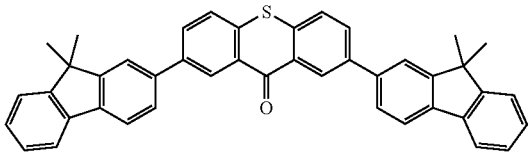

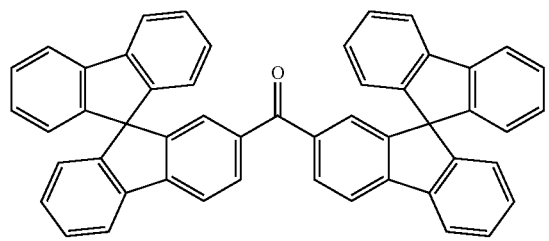

EM17

The electron-transporting material can be appropriately selected from those that can transport the electrons injected from a cathode to a light-emitting layer, with consideration for, for example, the balance with the hole mobility of a hole-transporting material. Examples of the material having an electron transporting property include oxadiazole derivatives, oxazole derivatives, pyrazine derivatives, triazole derivatives, triazine derivatives, quinoline derivatives, quinoxaline derivatives, phenanthroline derivatives, organic aluminum complexes, and condensed ring compounds (e.g., fluorene derivatives, naphthalene derivatives, chrysene derivatives, and anthracene derivatives). These electron-transporting materials can also be used in the hole blocking layer.

Examples of the compound that is used as the electron-transporting material are shown below, but the present invention is not limited to the following compounds.

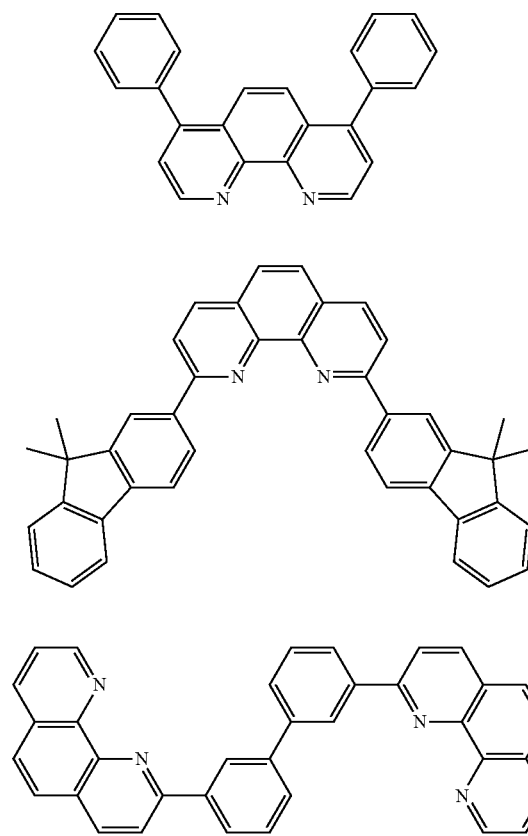

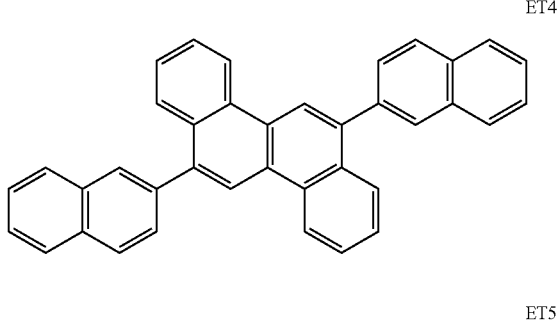

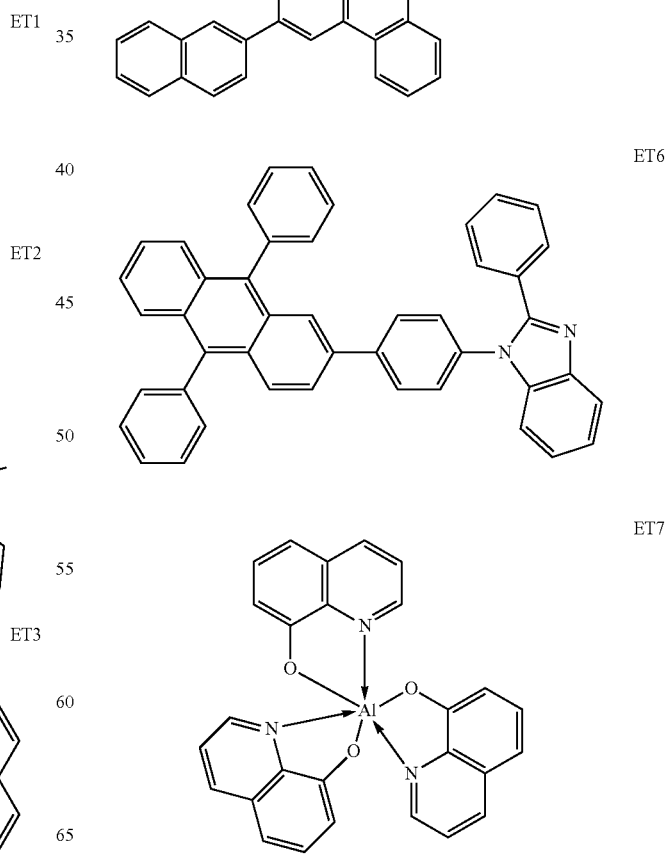

ET8

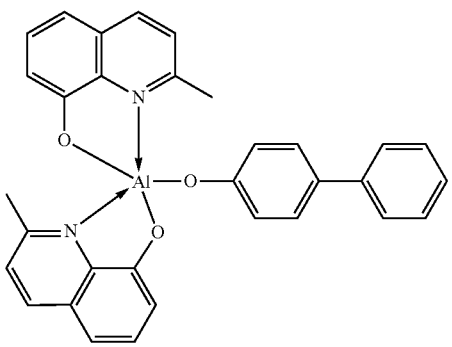

ET9

ET10

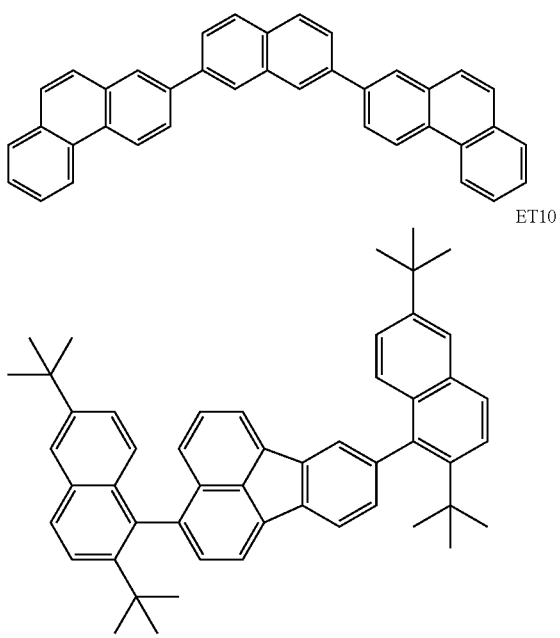

The constitutional material of the anode can have a work function as high as possible. Examples of such a material include simple metals such as gold, platinum, silver, copper, nickel, palladium, cobalt, selenium, vanadium, and tungsten; alloys of these simple metals; and metal oxides such as tin oxide, zinc oxide, indium oxide, indium tin oxide (ITO), and indium zinc oxide. Electrically conductive polymers, such as polyaniline, polypyrrole, and polythiophene, also can be used.

These electrode materials may be used alone or in combination of two or more thereof. The anode may have a monolayer structure or a multilayer structure.

The constitutional material of the cathode can have a low work function and strong reducibility. Examples of such a material include alkali metals, such as lithium; alkaline earth metals, such as calcium; simple metals, such as aluminum, titanium, manganese, silver, lead, and chromium; alloys of these simple metals, such as magnesium-silver, aluminum-lithium, and aluminum-magnesium; and metal oxides, such as indium tin oxide (ITO). These electrode materials may be used alone or in combination of two or more thereof. The cathode may have a monolayer structure or a multilayer structure.

Organic compound layers (such as hole-injecting layer, hole-transporting layer, electron-blocking layer, light-emitting layer, hole-blocking layer, electron-transporting layer, blocking layer, and electron-injecting layer) constituting the organic light-emitting device of the present invention can be formed by the following processes.

The organic compound layers constituting the organic light-emitting device of the present invention can be formed by a dry process, such as vacuum deposition, ion vapor deposition, sputtering, or a plasma process; or a wet process by a known coating process using a solution of an appropriate solvent (e.g., spin coating, dipping, casting, an LB method, or an ink jet method).

A layer formed by vacuum deposition or coating of a solution hardly causes, for example, crystallization and has excellent time stability. In the case of forming a film by coating, the solution may contain an appropriate binder resin.

Examples of the binder resin include, but not limited to, polyvinylcarbazole resins, polycarbonate resins, polyester resins, ABS resins, acrylic resins, polyimide resins, phenol resins, epoxy resins, silicone resins, and urea resins.

These binder resins may be singly used as a homopolymer or a copolymer or as a mixture of two or more of polymers. The solution for forming a film may further optionally contain additives such as known plasticizer, antioxidant, and ultraviolet absorber.

Application of Organic Light-Emitting Device

The organic light-emitting device of the present invention can be used as a constitutional member of a display apparatus or a lighting apparatus. The device can also be used in, for example, an exposure light source of an image formation apparatus of an electrophotography type, a backlight of a liquid crystal display apparatus, or a light-emitting apparatus including a color filter in the white light source. Examples of the color filter include filters through which, for example, light of three colors, red, green, and blue, passes.

The display apparatus of the present invention includes the organic light-emitting devices of the present invention in a display section. This display section includes a plurality of pixels.

Each pixel has the organic light-emitting device of the present invention and a transistor as an example of an active device (switching device) or an amplification device for controlling luminance. The anode or the cathode of the organic light-emitting device is electrically connected to the drain electrode or the source electrode of the transistor. The display apparatus can be used as an image display apparatus of, for example, a PC. An example of the transistor is a TFT device. The TFT device is disposed on, for example, an insulating surface of a substrate.

The display apparatus may be an information processing system that includes an image input section for inputting image information from, for example, an area CCD, a linear CCD, or a memory card and displays the input image on the display section.

The display section of an image pickup apparatus or an ink jet printer may have a touch panel function. The touch panel function may be driven by any driving system.

The display apparatus may be used in the display section of a multi-functional printer.

The lighting apparatus is an apparatus for lighting, for example, a room. The lighting apparatus may emit light of white (color temperature: 4200 K), neutral white (color temperature: 5000 K), or any color from blue to red.

The lighting apparatus of the present invention includes the organic light-emitting device of the present invention and an AC/DC converter circuit (circuit for converting an alternating voltage into a direct voltage) connected to the organic light-emitting device. The lighting apparatus may further include a color filter.

The image formation apparatus of the present invention includes a photosensitive member, a charging unit for charging a surface of the photosensitive member, an exposure unit for exposing the photosensitive member to light to form an electrostatic latent image, and a developing unit for developing the latent image formed on the surface of the photosensitive member. The exposure unit of the image formation apparatus includes the organic light-emitting device of the present invention.

The organic light-emitting device of the present invention can be used as a constitutional member of the exposure apparatus for exposing the photosensitive member to light. In the exposure apparatus including the organic light-emitting device of the present invention, for example, the organic light-emitting devices of the present invention may be arranged in a line along a predetermined direction.

The display apparatus of the present invention will now be described with reference to the drawings. FIG. 1 is a schematic cross-sectional view illustrating an example of a display apparatus including organic light-emitting devices and TFT devices connected to the organic light-emitting devices. The organic light-emitting devices constituting the display apparatus 1 of FIG. 1 are the organic light-emitting devices of the present invention.

The display apparatus 1 of FIG. 1 includes a substrate 11, such as a glass substrate, and a moisture-proof film 12 disposed on the substrate for protecting the TFT devices or the organic compound layer. Reference number 13 denotes a metal gate electrode; reference number 14 denotes a gate insulating film; and reference number 15 denotes a semiconductor layer.

The TFT device 18 includes a semiconductor layer 15, a drain electrode 16, and a source electrode 17. An insulating film 19 is disposed above the TFT device 18. The source electrode 17 is connected to the anode 21 of the organic light-emitting device via a contact hole 20.

The electrodes (anode and cathode) of the organic light-emitting device and the electrodes (source electrode and drain electrode) of the TFT may be electrically connected by any system, without being limited to the mode shown in FIG. 1, as long as either the anode or the cathode is electrically connected to either the source electrode or the drain electrode of the TFT device.

In the display apparatus 1 of FIG. 1, the organic compound layer composed of multiple layers is drawn as one layer. The organic compound layer 22 may be composed of a plurality of layers. A first protection layer 24 and a second protection layer 25 are disposed on a cathode 23 for inhibiting degradation of the organic light-emitting device.

When the display apparatus 1 of FIG. 1 emits white light, the light-emitting layer in the organic compound layer 22 in FIG. 1 may be a layer of a mixture of a red light-emitting material, a green light-emitting material, and a blue light-emitting material. Alternatively, the light-emitting layer may be a laminate of a layer of a red light-emitting material, a layer of a green light-emitting material, and a layer of a blue light-emitting material. In another mode, a red light-emitting material, a layer of a green light-emitting material, and a layer of a blue light-emitting material may be horizontally arranged, and the respective domains may be formed in a single light-emitting layer.

In the display apparatus 1 of FIG. 1, the switching device is a transistor. Instead of this, MIM device may be used as the switching device.

The transistor used in the display apparatus 1 of FIG. 1 is not limited to the transistor using a single crystal silicon wafer and may be a thin-film transistor including an active layer on the insulating surface of a substrate. The thin-film transistor may include, as an active layer, single crystalline silicon, non-single-crystalline silicon such as amorphous silicon or microcrystalline silicon, or a non-single-crystalline oxide semiconductor such as indium zinc oxide or indium gallium zinc oxide. The thin-film transistor is also called a TFT device.

The switching device used in, for example, a display apparatus of the present invention may include an oxide semiconductor in the channel portion (active region). The oxide semiconductor part of the switching device may be amorphous or crystal or may include both amorphous portions and crystalline portions. When the oxide semiconductor (part) is constituted of crystals, the crystalline form may be, but not limited to, a single crystal, microcrystals, or crystals of which specific axis, such as the C-axis, is oriented. Alternatively, at least two of these forms may coexist.

The organic light-emitting device including such a switching device may be used as each pixel of an image display apparatus or may be used in an exposure unit for exposing the photosensitive member of an image formation apparatus of an electrophotography type, such as a lighting apparatus, laser beam printer, or copying machine.

The transistors of the display apparatus 1 of FIG. 1 may be formed in a substrate such as a Si substrate. The term "in a substrate" means that transistors are formed by processing the substrate, such as a Si substrate, itself. That is, having transistors in a substrate can be regarded as that the substrate and the transistors are integrally formed.

Whether or not transistors are formed in a substrate is selected depending on the target resolution. In a resolution of about 1-inch QVGA, for example, the organic light-emitting devices can be disposed in a Si substrate.

Figure 2:
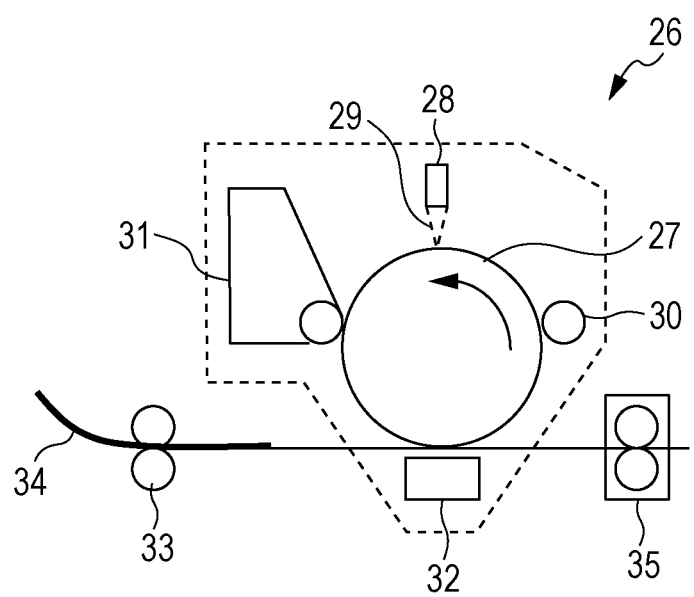
FIG. 2 is a schematic view illustrating an example of an image formation apparatus including organic light-emitting devices according to the present invention.

Other uses of the organic light-emitting device of the present invention will now be described. FIG. 2 is a schematic view illustrating an example of an image formation apparatus including organic light-emitting devices according to the present invention. The image formation apparatus 26 of FIG. 2 includes a photosensitive member 27, an exposure light source 28, a developing device 30, a charging unit 31, a transfer unit 32, conveying rollers 33, and a fuser 35.

In the image formation apparatus 26 of FIG. 2, light 29 is irradiated from the exposure light source 28 toward the photosensitive member 27, and an electrostatic latent image is formed on the surface of the photosensitive member 27. In the image formation apparatus 26 of FIG. 2, the exposure light source 28 includes a plurality of the organic light-emitting devices according to the present invention; the developing device 30 is a developing unit for developing the electrostatic latent image and includes toner and other components; the charging unit 31 charges the photosensitive member 27; and the transfer unit 32 transfers the developed image to a recording medium 34, such as paper. The recording medium 34 is conveyed to the transfer unit 32 with the conveying rollers 33. In the image formation apparatus 26 of FIG. 2, the fuser 35 fixes the image formed on the recording medium 34.

Figure 3A:
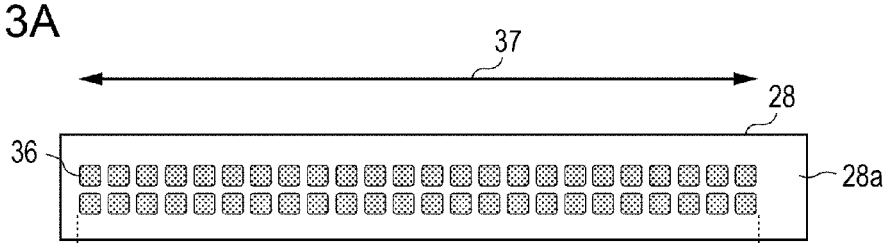
FIGS. 3A and 3B are schematic plan views illustrating examples of exposure light sources constituting the image formation apparatus shown in FIG. 2.
Figure 3B:
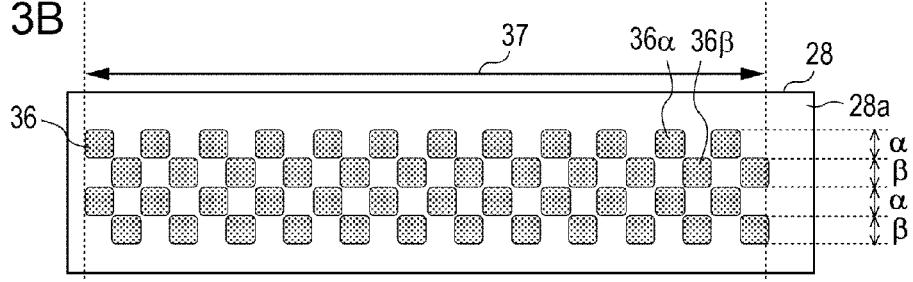
Figure 3C:
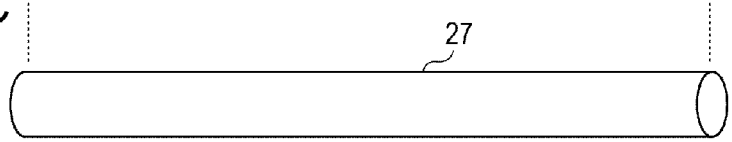
FIG. 3C is a schematic view illustrating an example of a photosensitive member constituting the image formation apparatus shown in FIG. 2.

FIGS. 3A and 3B are schematic plan views illustrating examples of the exposure light source (exposure apparatus) of the image formation apparatus 26 shown in FIG. 2. FIG. 3C is a schematic view illustrating an example of the photosensitive member of the image formation apparatus 26 shown in FIG. 2. The exposure light source 28 of FIG. 3A and the exposure light source 28 of FIG. 3B are the same in that a plurality of light-emitting parts 36 each including an organic light-emitting device are arrayed on a long substrate 28a and that the light-emitting parts 36 are arrayed along the long axis direction of the photosensitive member 27. The arrows of reference number 37 denote the column direction in which the light-emitting parts 36 are arrayed. This column direction is the same as that of the axis of rotation of the photosensitive member 27.

The light-emitting parts 36 in FIG. 3A are arrayed along the axial direction of the photosensitive member 27, whereas in FIG. 3B, the light-emitting parts 36 in a first line α and the light-emitting parts 36 in a second line β are alternately arrayed in the column direction. That is, in FIG. 3B, the light-emitting parts in the first line α and those in the second line β are arrayed at positions different from each other in the row direction.

In FIG. 3B, the light-emitting parts 36α in the first line α are arrayed at regular intervals, and the light-emitting parts 36β in the second line β are arrayed at the positions corresponding to the intervals of the light-emitting parts 36α in the first line α. That is, in the exposure light source of FIG. 3B, a plurality of light-emitting parts are arrayed at regular intervals also in the row direction.

In other words, the light-emitting parts (36α, 36β) constituting the exposure light source of FIG. 3B are arrayed in, for example, a lattice, checker lattice, or checkered pattern.

Figure 4:
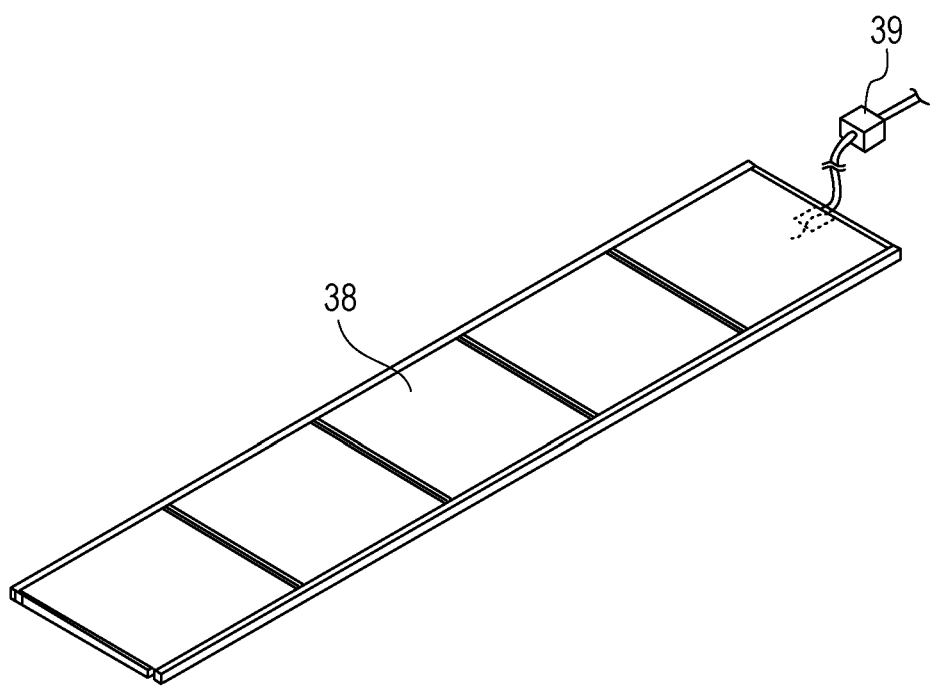
FIG. 4 is a schematic view illustrating an example of a lighting apparatus including organic light-emitting devices according to the present invention.

FIG. 4 is a schematic view illustrating an example of a lighting apparatus including organic light-emitting devices according to the present invention. The lighting apparatus of FIG. 4 includes organic light-emitting device 38 disposed on a substrate (not shown) and an AC/DC converter circuit 39. The lighting apparatus of FIG. 4 may include a radiator plate (not shown) corresponding to the heat radiation section for releasing heat in the apparatus to the outside, for example, on the substrate surface on the side opposite to the side where the organic light-emitting devices 38 are mounted.

EXAMPLES

The present invention will now be described in detail by examples, but is not limited to the following examples.

Synthesis of Lithium Complex

A complex of Formula [1] that is used as a constitutional material of the organic light-emitting device of the present invention can be synthesized by, for example, the following synthesis route:

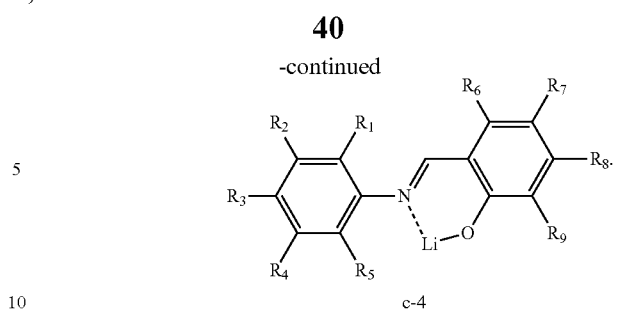

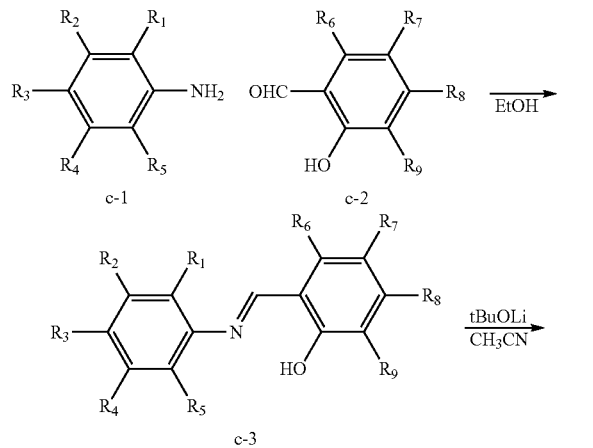

This synthesis scheme includes the following steps (i) and (ii):

(i) A step (ligand synthesis step) of preparing ligand (c-3) by heating an aromatic amine (compound c-1) and a salicylaldehyde derivative (compound c-2) in ethanol with stirring; and (ii) A step (complex synthesis step) of synthesizing a complex of Formula [1] by heating tert-butoxylithium and ligand (c-3) in acetonitrile with stirring.

Synthesis Example 1

Synthesis of Example Compound A-1

Compound A-1 was synthesized in accordance with the following scheme:

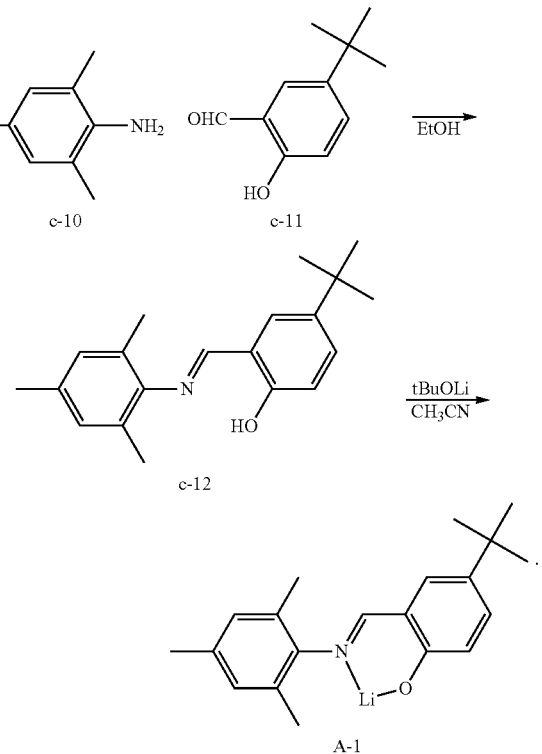

(1) Ligand Synthesis Step

The following reagents and solvent were placed in a 100-mL three-necked flask:
Compound c-10: 1.35 g (10.0 mmol);
Compound c-11: 1.78 g (10.0 mmol); and
Ethanol: 40 mL.

The reaction solution was heated to 80° C. and was stirred at this temperature (80° C.) for 5 hours. After the completion of the reaction, the ethanol was distilled to yield 2.86 g of compound c-12 as a yellow solid.

(2) Complex Synthesis Step

The following reagents and solvent were placed in a 100-mL three-necked flask:
Compound c-12: 1.00 g (3.38 mmol);
Tert-Butoxylithium: 0.24 g (3.00 mmol); and
Acetonitrile: 30 mL.

The reaction solution was heated to 70° C. and was stirred at this temperature (70° C.) for 5 hours. After the completion of the reaction, the reaction solution was filtered to give a whitish yellow solid. The solid on the filter was washed with acetonitrile and was vacuum-dried to yield 0.55 g of Compound A-1 as a whitish yellow solid.

The molecular ion, $M^+$, of Example Compound A-1 was observed at m/z 301 by mass spectrometry.

Synthesis Examples 2 to 5

Complexes were synthesized as in Synthesis Example 1 except that the aromatic amine and the salicylaldehyde derivative used in the step (1) of Synthesis Example 1 were changed to those shown in Table 2.

Synthesis Example 6

Synthesis of Example Compound C-1

Compound C-1 was synthesized in accordance with the following scheme:

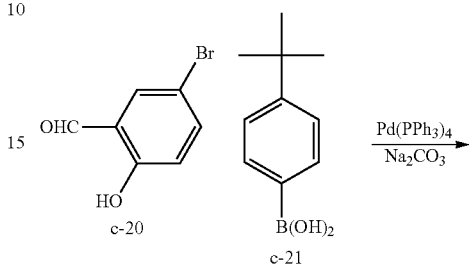

TABLE 2

| | Structure of Complex | Aromatic amine | Salicylaldehyde derivative |
|---|---|---|---|
| Example compound A-2 | 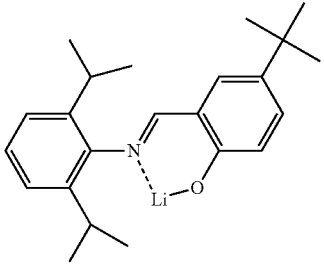 | 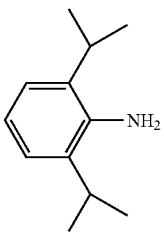 | 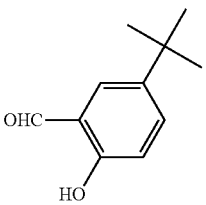 |
| Example Compound A-4 | 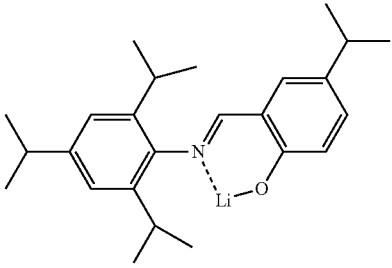 | 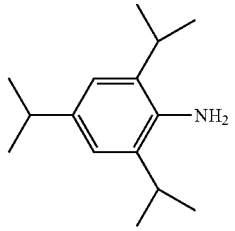 [SMILES: CC(C)c1cc(C(C)C)c(N)c(C(C)C)c1] | 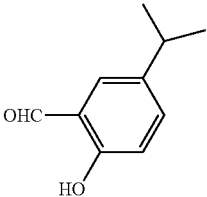 |
| Example Compound B-1 | 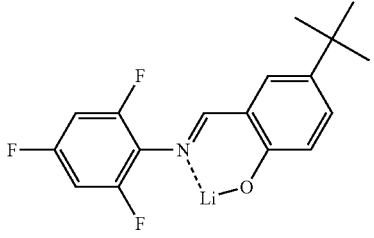 | 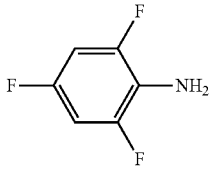 | 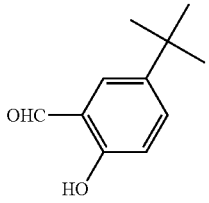 |
| Example Compound B-7 | 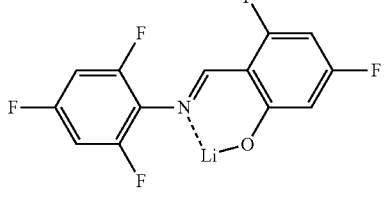 | 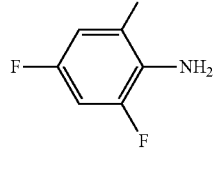 | 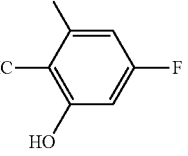 |

-continued

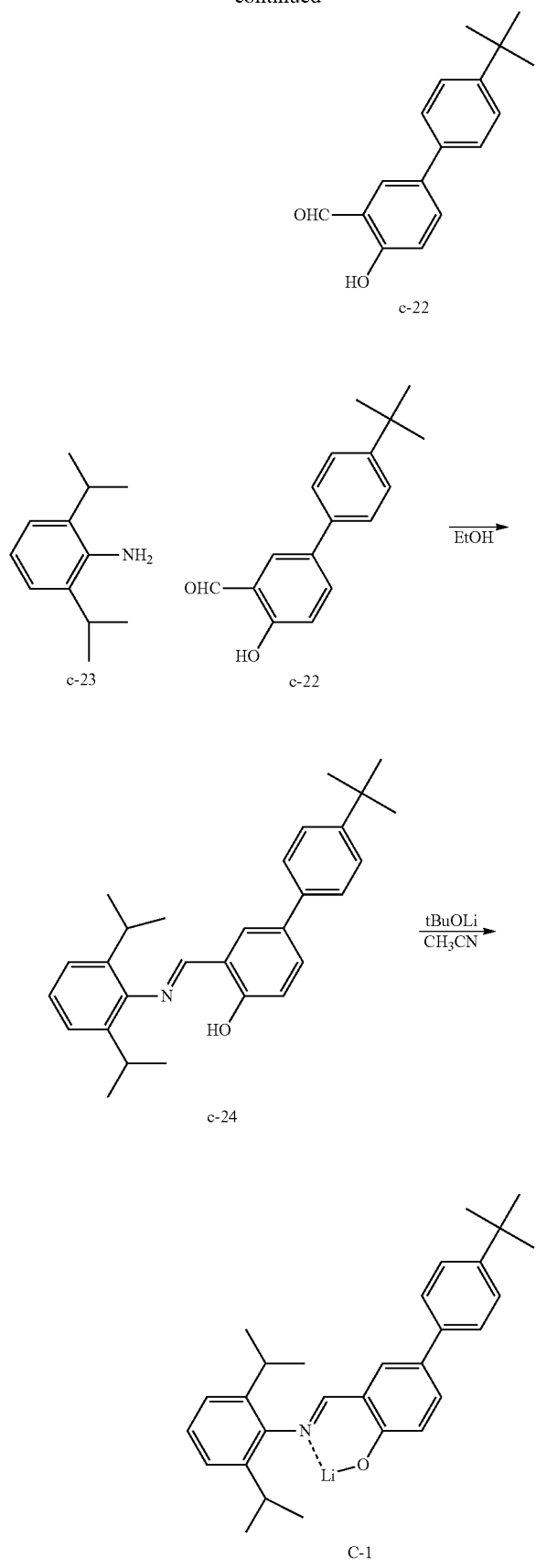

(1) Ligand Synthesis Step

The following reagents and solvent were placed in a 100-mL three-necked flask:
Compound c-20: 2.01 g (10.0 mmol);
Compound c-21: 1.78 g (10.0 mmol);
Sodium carbonate: 10 g;
Toluene: 20 mL;
Water: 10 mL; and
Ethanol: 10 mL.

The reaction solution was stirred and then heated to 80° C. and was stirred at this temperature (80° C.) for 5 hours. After the completion of the reaction, the ethanol was distilled to yield 1.22 g of compound c-22 as a yellow solid.

The following reagents and solvent were placed in a 100-mL three-necked flask:
Compound c-22: 1.20 g (4.72 mmol);
Compound c-23: 0.84 g (4.80 mmol); and
Ethanol: 30 mL.

The reaction solution was heated to 80° C. and was stirred at this temperature (80° C.) for 5 hours. After the completion of the reaction, the ethanol was distilled to yield 1.21 g of compound c-24 as a yellow solid.

(2) Complex Synthesis Step

The following reagents and solvent were placed in a 100-mL three-necked flask:
Compound c-24: 1.20 g (2.91 mmol);
Tert-Butoxylithium: 0.216 g (2.70 mmol); and
Acetonitrile: 30 mL.

The reaction solution was heated to 70° C. and was stirred at this temperature (70° C.) for 5 hours. After the completion of the reaction, the reaction solution was filtered to give a whitish yellow solid. The solid on the filter was washed with acetonitrile and was vacuum-dried to yield 0.51 g of Compound C-1 as a whitish yellow solid.

The molecular ion, $M^+$, of Example Compound C-1 was observed at m/z 419 by mass spectrometry.

Synthesis Examples 7 to 11

Complexes were synthesized as in Synthesis Example 6 except that the salicylaldehyde derivative, the boronic acid derivative, and the aromatic amine used in the step (1) of Synthesis Example 6 were changed to those shown in Table 3.

TABLE 3

| | Structure of Complex | Salicylaldehyde derivative |
|---|---|---|
| Example compound C-3 | | 5-bromosalicylaldehyde |
| Example Compound C-6 | | 5-bromosalicylaldehyde |
| Example Compound C-7 | | 5-bromosalicylaldehyde |
| Example Compound D-2 | | 5-bromosalicylaldehyde |

TABLE 3-continued

| | | Boronic acid derivative | Aromatic amine |
|---|---|---|---|
| Example Compound D-3 | (structure: 2,6-diisopropylphenyl-N=CH-phenyl-phenyl-CF3 with Li-O chelate) | | OHC-C6H3(OH)-Br |
| Example compound C-3 | | 3,5-di-tert-butylphenylboronic acid | 2,6-diisopropylaniline |
| Example Compound C-6 | | 3,7-di-tert-butylnaphthalen-1-ylboronic acid | 2,4,6-triisopropylaniline |
| Example Compound C-7 | | 9,9-dimethylfluoren-2-ylboronic acid | 2,4,6-trimethylaniline |
| Example Compound D-2 | | 3,5-di-tert-butylphenylboronic acid | 2,6-difluoroaniline |
| Example Compound D-3 | | 4-(trifluoromethyl)phenylboronic acid | 2,6-diisopropylaniline |

Example 1

In this example, an organic light-emitting device including an anode, a hole-transporting layer, a light-emitting layer, an electron-transporting layer, an electron-injecting layer, and a cathode on a substrate in this order was produced by the process described below. A part of the materials used in this example are shown below:

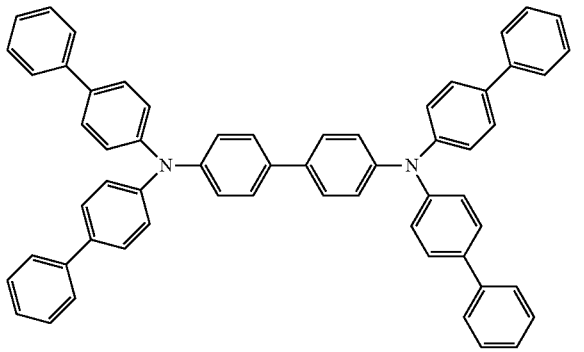

h-1

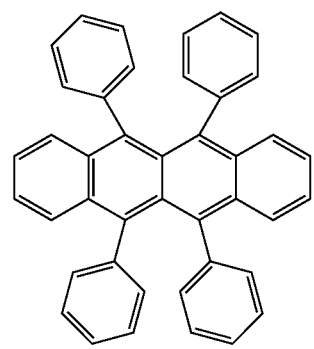

h-2

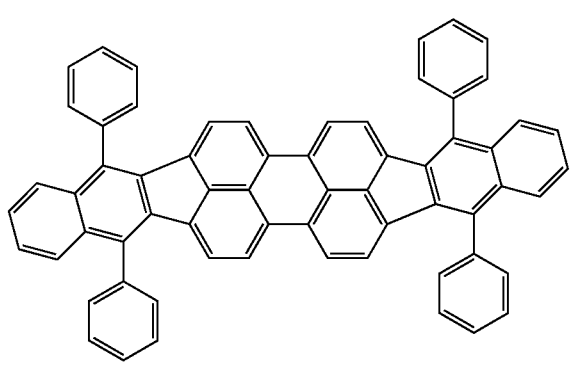

h-3

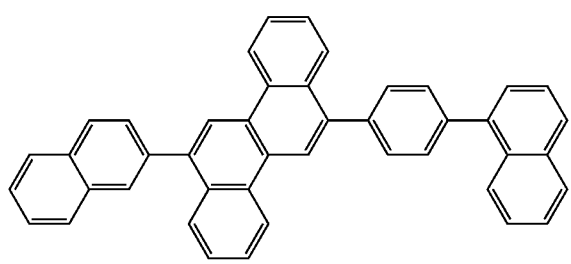

h-4

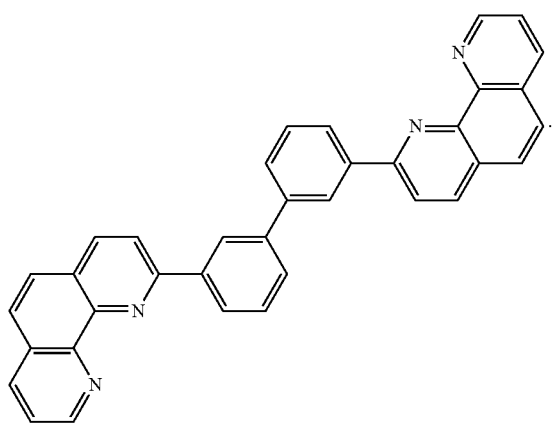

h-5

An anode was formed on a glass substrate by sputtering indium tin oxide (ITO). The substrate provided with the anode was subjected to ultrasonic cleaning with acetone and isopropyl alcohol (IPA) sequentially, was then washed by boiling in IPA, and was dried. The substrate provided with the anode was further subjected to UV and ozone cleaning and was then used as a transparent electrically conductive support substrate in the following steps.

The organic compound layers and electrode layer shown in Table 4 were sequentially formed on the transparent electrically conductive support substrate by resistance heating vacuum deposition in a vacuum chamber of $10^{-5}$ Pa to produce an organic light-emitting device.

TABLE 4

| | Constitutional material | Film thickness (nm) |
|---|---|---|
| Hole-transporting layer | Compound h-1 | 40 |
| Light-emitting layer | Guest: compound h-3<br>Host: compound h-2<br>Guest:host = 0.5:99.5<br>(weight ratio) | 30 |
| Electron-transporting layer | Compound h-4 | 10 |
| Electron-injecting layer | Example Compound A-1 and compound h-5<br>A-1:h-5 = 50:50<br>(weight ratio) | 0.5 |
| Metal electrode layer (cathode) | Al | 150 |

A voltage of 5 V was applied to the resulting device to observe red light with a luminous efficiency of 5.8 cd/m² and CIE chromaticity coordinates of (0.65, 0.35) emitted by the luminescent dopant h-3. The device was continuously driven for 24 hours in a 70% humidity environment while maintaining a current density of 100 mA/cm². The degradation ratio of the luminance after 24 hours to the initial luminance was low.

Examples 2 to 7

A part of materials used in Examples 2 to 7 are shown below:
Lithium complex: Example Compounds A-2, B-1, C-3, or D-3; and Electron-injecting materials: any one of the following compounds:

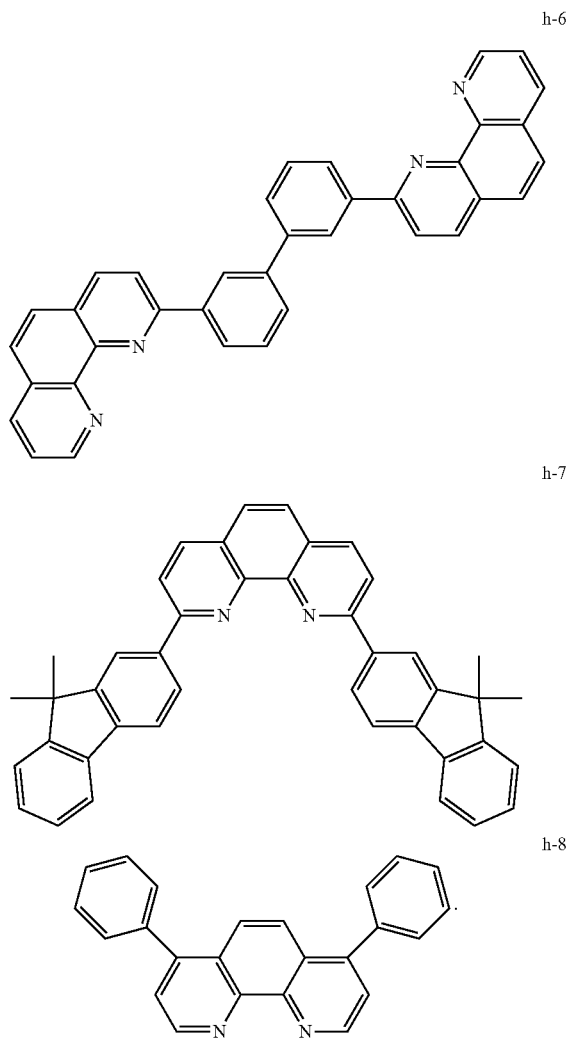

Organic light-emitting devices were produced as in Example 1 except that the combination of constitutional materials of the electron-injecting layer in each example was changed to those shown in Table 5. In the formation of the electron-injecting layer, the mixing ratio between the lithium complex and the electron-injecting material (compound other than the lithium complex contained in the electron-injecting layer) is as follows:

Lithium complex : electron-injecting material=50:50 (weight ratio).

The resulting devices were evaluated as in Example 1. Table 5 shows the results.

TABLE 5

| | Electron-injecting layer | | | | |
|---|---|---|---|---|---|
| | Complex | Electron-injecting material | Luminous efficiency*[1] (cd/A) | CIE chromaticity | Luminance degradation*[2] |
| Example 2 | A-2 | h-6 | 5.4 | (0.65, 0.35) | low |
| Example 3 | B-1 | h-6 | 5.4 | (0.64, 0.35) | low |
| Example 4 | C-3 | h-7 | 5.3 | (0.65, 0.35) | low |
| Example 5 | D-3 | h-7 | 5.4 | (0.64, 0.35) | low |
| Example 6 | A-2 | h-8 | 5.1 | (0.64, 0.35) | low |
| Example 7 | C-3 | h-8 | 5.1 | (0.65, 0.35) | low |

*[1]Current efficiency at an applied voltage of 5 V
*[2]Evaluation of the change in luminance after driving at a current density of 100 mA/cm² in a 70% humidity environment for 24 hours Example 8

An organic light-emitting device was produced as in Example 1 except that only Example Compound A-1 was used in the formation of the electron-injecting layer.

A voltage of 5 V was applied to the resulting organic light-emitting device to observe red light with a luminous efficiency of 4.8 cd/m² and CIE chromaticity coordinates (0.65, 0.35) emitted by the luminescent dopant (compound h-3).

Examples 9 to 11

Organic light-emitting devices were produced as in Example 8 except that the lithium complexes shown in Table 6 were used as the constitutional materials of the electron-injecting layers instead of Example Compound A-1 in Example 8. The resulting organic light-emitting devices were evaluated as in Example 8. Table 6 shows the results.

TABLE 6

| | Complex | Luminous efficiency*[1] (cd/A) | CIE chromaticity |
|---|---|---|---|
| Example 9 | A-2 | 4.7 | (0.65, 0.35) |
| Example 10 | C-3 | 4.5 | (0.64, 0.35) |
| Example 11 | C-6 | 4.3 | (0.65, 0.35) |

*[1]Current efficiency at an applied voltage of 5 V

The present invention can provide an organic light-emitting device that is driven with a low voltage and has a high luminous efficiency and a long device lifetime.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-084552, filed Apr. 16, 2014, which is hereby incorporated by reference herein in its entirety.

What is claimed is:
1. An organic light-emitting device comprising:
an anode;
a cathode;
a light-emitting layer disposed between the anode and the cathode;

an organic compound layer disposed between the cathode and the light-emitting layer,
wherein the organic compound layer includes a complex represented by Formula [1]:

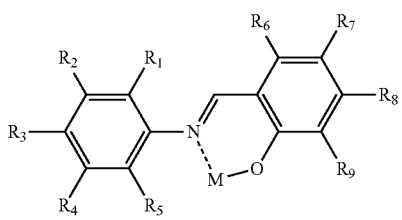

where M represents lithium, sodium, potassium, rubidium, or cesium;
$R_1$ and $R_5$ each independently represent an alkyl group having 1 to 8 carbon atoms or a fluorine atom; and
$R_2$ to $R_4$ and $R_6$ to $R_9$ each independently represent a hydrogen atom, a fluorine atom, an alkyl group having 1 to 8 carbon atoms, or an aryl group, the alkyl group being able to have a fluorine atom, provided that at least one of $R_1$ to $R_9$ represents a fluorine atom or at least one of $R_1$ to $R_9$ represents an alkyl group having 1 to 8 carbon atoms and having a fluorine atom or at least one of $R_6$ to $R_9$ represents the aryl group, wherein
when any one of $R_2$ to $R_4$ and $R_6$ to $R_9$ represents an aryl group, the aryl group optionally further includes a fluorine atom or an alkyl group having 1 to 8 carbon atoms; and
when any one of $R_1$ to $R_9$ represents an alkyl group, a part or all of the hydrogen atoms of the alkyl group are optionally replaced by fluorine atoms.

2. The organic light-emitting device according to claim 1, wherein M represents lithium.

3. The organic light-emitting device according to claim 1, wherein at least one of the alkyl groups represented by $R_1$ to $R_9$ or at least one of the aryl groups represented by $R_2$ to $R_4$ and $R_6$ to $R_9$ includes a fluorine atom.

4. The organic light-emitting device according to claim 1, wherein at least one of $R_1$ to $R_9$ represents a fluorine atom.

5. The organic light-emitting device according to claim 1, wherein the organic compound layer contacts the cathode.

6. The organic light-emitting device according to claim 1, wherein at least one of $R_6$ to $R_9$ represents an aryl group.

7. The organic light-emitting device according to claim 6, wherein the aryl group further includes a fluorine atom or an alkyl group having 1 to 8 carbon atoms.

8. The organic light-emitting device according to claim 1, the light-emitting layer comprises a plurality of light-emitting layers,
wherein the organic light-emitting device emits white light.

9. The organic light-emitting device according to claim 8, further comprising a color filter.

10. A display apparatus comprising:
a plurality of pixels, wherein
at least one of the pixels includes the organic light-emitting device according to claim 1 and an active device connected to the organic light-emitting device.

11. The display apparatus according to claim 10, wherein the active device is a transistor; and
the transistor includes an oxide semiconductor in its active region.

12. An information processing system comprising:
an image input section for inputting image information; and
a display section for displaying an image,
wherein the display section is the display apparatus according to claim 10.

13. A lighting apparatus comprising:
the organic light-emitting device according to claim 1; and
an AC/DC converter for supplying a driving voltage to the organic light-emitting device.

14. A lighting apparatus comprising:
the organic light-emitting device according to claim 1; and
a heat radiation section for releasing heat in the apparatus to the outside.

15. An image formation apparatus comprising:
a photosensitive member;
a charging unit for charging a surface of the photosensitive member;
an exposure unit for exposing the photosensitive member to light; and
a developing unit for developing an electrostatic latent image formed on the surface of the photosensitive member,
wherein the exposure unit includes the organic light-emitting device according to claim 1.

16. An exposure apparatus for exposing a photosensitive member to light, comprising:
plurality of the organic light-emitting devices according to claim 1, wherein
the organic light-emitting devices are arranged in a line along the long axis direction of the photosensitive member.

17. An organic light-emitting device comprising:
an anode;
a cathode;
a light-emitting layer disposed between the anode and the cathode;
an organic compound layer disposed between the cathode and the light-emitting layer,
wherein the organic compound layer includes a complex represented by Formula [1]:

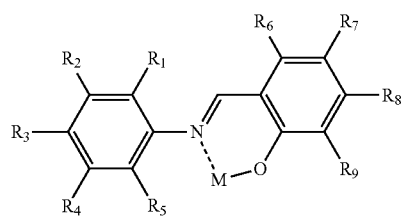

where M represents lithium, sodium, potassium, rubidium, or cesium;
$R_1$ and $R_5$ each independently represent an alkyl group having 1 to 8 carbon atoms or a fluorine atom; and
$R_2$ to $R_4$ and $R_6$ to $R_9$ each independently represent a hydrogen atom, a fluorine atom, an alkyl group having 1 to 8 carbon atoms, or an aryl group, the alkyl group being able to have a fluorine atom, provided that at least one of $R_2$ to $R_4$ and $R_6$ to $R_9$ represents the aryl group including a fluorine atom, wherein when any one of $R_2$ to $R_4$ and $R_6$ to $R_9$ represents an aryl group, the aryl group optionally further includes a fluorine atom or an alkyl group having 1 to 8 carbon atoms; and when any one of $R_1$ to $R_9$ represents an alkyl group, a part or all of the hydrogen atoms of the alkyl group are optionally replaced by fluorine atoms.

18. A complex represented by Formula [1]:

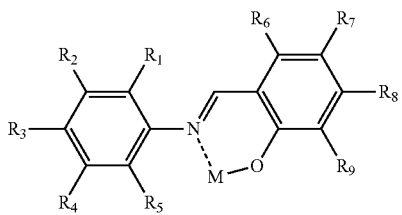

[1]

where M represents lithium, sodium, potassium, rubidium, or cesium;

$R_1$ and $R_5$ each independently represent an alkyl group having 1 to 8 carbon atoms or a fluorine atom; and $R_2$ to $R_4$ and $R_6$ to $R_9$ each independently represent a hydrogen atom, a fluorine atom, an alkyl group having 1 to 8 carbon atoms, or an aryl group, the alkyl group being able to have a fluorine atom, provided that at least one of $R_1$ to $R_9$ represents a fluorine atom or at least one of $R_6$ to $R_9$ represents an alkyl group having 1 to 8 carbon atoms and having a fluorine atom or at least one of $R_6$ to $R_9$ represents the aryl group, wherein when any one of $R_2$ to $R_4$ and $R_6$ to $R_9$ represents an aryl group, the aryl group optionally further includes a fluorine atom or an alkyl group having 1 to 8 carbon atoms; and when any one of $R_1$ to $R_9$ represents an alkyl group, a part or all of the hydrogen atoms of the alkyl group are optionally replaced by fluorine atoms.

\* \* \* \* \*